United States Patent
Lim et al.

(10) Patent No.: US 9,462,682 B2
(45) Date of Patent: Oct. 4, 2016

(54) CONDUCTIVE STRUCTURE AND METHOD FOR MANUFACTURING SAME

(71) Applicant: LG CHEM, LTD., Seoul (KR)

(72) Inventors: Jin Hyong Lim, Daejeon (KR); Sujin Kim, Daejeon (KR); Ki-Hwan Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 87 days.

(21) Appl. No.: 14/424,321

(22) PCT Filed: Aug. 30, 2013

(86) PCT No.: PCT/KR2013/007858
§ 371 (c)(1),
(2) Date: Feb. 26, 2015

(87) PCT Pub. No.: WO2014/035197
PCT Pub. Date: Mar. 6, 2014

(65) Prior Publication Data
US 2015/0223326 A1    Aug. 6, 2015

(30) Foreign Application Priority Data
Aug. 31, 2012   (KR) .................. 10-2012-0096493

(51) Int. Cl.
    G06F 3/045    (2006.01)
    H05K 1/02     (2006.01)
    G06F 3/041    (2006.01)
    G06F 3/044    (2006.01)
    (Continued)

(52) U.S. Cl.
    CPC ............. *H05K 1/0274* (2013.01); *C23C 14/34* (2013.01); *G06F 1/16* (2013.01); *G06F 3/041* (2013.01); *G06F 3/044* (2013.01); *G06F 3/045* (2013.01); *G06F 3/0412* (2013.01); *H05K 1/09* (2013.01); *H05K 3/061* (2013.01); *H05K 3/16* (2013.01); *H05K 3/46* (2013.01); *G06F 2203/04103* (2013.01)

(58) Field of Classification Search
CPC ...... H05K 1/0274; H05K 1/09; H05K 3/061; H05K 3/16; H05K 3/46; C23C 14/34; G06F 1/16; G06F 3/041; G06F 3/0412; G06F 3/044; G06F 3/045; G06F 2203/04103
USPC ......................................... 345/174
See application file for complete search history.

(56) References Cited

U.S. PATENT DOCUMENTS

| | | |
|---|---|---|
| 2010/0013798 A1 | 1/2010 | Nakajima et al. |
| 2011/0212392 A1 | 9/2011 | Iwashita et al. |
| 2011/0279403 A1 | 11/2011 | Lee et al. |
| 2012/0234663 A1 | 9/2012 | Hwang et al. |

(Continued)

FOREIGN PATENT DOCUMENTS

| | | | |
|---|---|---|---|
| EP | 2 312 423 A2 | 4/2011 | |
| JP | 2008-251822 A | 10/2008 | |

(Continued)

*Primary Examiner* — Mark Regn
(74) *Attorney, Agent, or Firm* — Dentons US LLP

(57) ABSTRACT

The disclosure provides a conductive structure body including a substrate; a conductive layer; and a darkening layer, and a method of manufacturing the same. The conductive structure body prevents reflection by a conductive layer without affecting conductivity of the conductive layer, and improves a concealing property of the conductive layer by improving absorbance. Accordingly, a display panel having improved visibility is developed by using the conductive structure body.

33 Claims, 16 Drawing Sheets

(51) Int. Cl.
   *C23C 14/34* (2006.01)
   *G06F 1/16* (2006.01)
   *H05K 1/09* (2006.01)
   *H05K 3/06* (2006.01)
   *H05K 3/16* (2006.01)
   *H05K 3/46* (2006.01)

(56) References Cited

U.S. PATENT DOCUMENTS

2013/0215067 A1* 8/2013 Hwang ................ G02B 5/003
                                                          345/173

FOREIGN PATENT DOCUMENTS

| JP | 2009-186929 A | 8/2009 |
| JP | 2010-027391 A | 2/2010 |
| JP | 2010-79169 A | 4/2010 |
| JP | 2012-118237 A | 6/2012 |
| KR | 10-2011-0126528 A | 11/2011 |
| KR | 10-2011-0131719 A | 12/2011 |
| KR | 10-2012-0040680 A | 4/2012 |
| KR | 10-2012-0089133 A | 8/2012 |
| KR | 10-2012-0092004 A | 8/2012 |
| WO | 2012/053818 A2 | 4/2012 |

* cited by examiner

CONDUCTIVE STRUCTURE AND METHOD FOR MANUFACTURING SAME

This application is a National Phase entry of PCT/KR2013/007858 filed on Aug. 30, 2013 and claims priority to Korean Application No. 10-2012-0096493 filed Aug. 31, 2012, both of which are incorporated by reference for all purposes as if fully set forth herein.

TECHNICAL FIELD

The present specification relates to a conductive structure body and a method for manufacturing the same.

BACKGROUND ART

Generally, a touch screen panel may be classified into the following types according to a detection manner of signal. That is, there are a resistive type detecting a position pressed by pressure in a state where a DC voltage is applied through a change in a current or voltage value, a capacitive type using capacitance coupling in a state where a AC voltage is applied, an electromagnetic type detecting a selected position in a state where a magnetic field is applied as a change in voltage, and the like.

In accordance with the recent increase in demand for a large-sized touch screen panel, a technology of reducing resistance of an electrode and implementing an enlarged touch screen panel having excellent visibility needs to be developed.

SUMMARY OF THE INVENTION

The present invention has been made in an effort to develop a technology for improving performance of various modes of touch screen panels in the art.

An exemplary embodiment of the present application provides a conductive structure body comprising: a substrate; a conductive layer; and a darkening layer satisfying the following Equations 1 and 2 to light having at least one wavelength of light having the wavelength of 550 nm to 650 nm:

$$|R| = \left| \frac{1}{(n+1)^2 + k^2} \left[ \{(n-1)^2 + k^2\} - 4nR_{Metal}\exp\left(-\frac{2\pi}{n}k\right) \right] \right| \leq 0.2 \quad \text{[Equation 1]}$$

$$d = \frac{\lambda}{4n} N (N = 1, 3, 5, \ldots) \quad \text{[Equation 2]}$$

wherein, $|R|$ is a parameter for reducing visuality of the conductive structure body, n is a refractive index, k is an extinction coefficient, $R_{Metal}$ is a reflectance of the conductive layer, d is a thickness of the darkening layer, and $\lambda$ is the wavelength of light.

Another exemplary embodiment of the present application provides a method for manufacturing a conductive structure body, comprising: forming a conductive layer on a substrate; and forming a darkening layer satisfying Equations 1 and 2 to light having at least one wavelength of light having the wavelength of 550 nm to 650 nm before, after, or before and after the conductive layer is formed.

Another exemplary embodiment of the present application provides a method for manufacturing a conductive structure body, comprising: forming a patterned conductive layer on a substrate; and forming a patterned darkening layer satisfying Equations 1 and 2 to light having at least one wavelength of light having the wavelength of 550 nm to 650 nm before, after, or before and after the patterned conductive layer is formed.

Another exemplary embodiment of the present application provides a touch screen panel including the conductive structure body.

Another exemplary embodiment of the present application provides a display device including the conductive structure body.

Another exemplary embodiment of the present application provides a solar battery including the conductive structure body.

The conductive structure body according to the exemplary embodiment of the present application can prevent reflection by a conductive layer without affecting conductivity of the conductive layer, and improve a concealing property of the conductive layer by improving absorbance. In addition, the touch screen panel having improved visibility and the display device and the solar battery including the same can be developed by using the conductive structure body according to the exemplary embodiment of the present application.

BRIEF DESCRIPTION OF THE DRAWINGS

FIG. 9 illustrates a color according to n and k values under an extinction interference condition at a wavelength of 600 nm when the Al lower electrode having reflectance of 90% is used as the exemplary embodiment of the present application.

DETAILED DESCRIPTION

Figure 1:
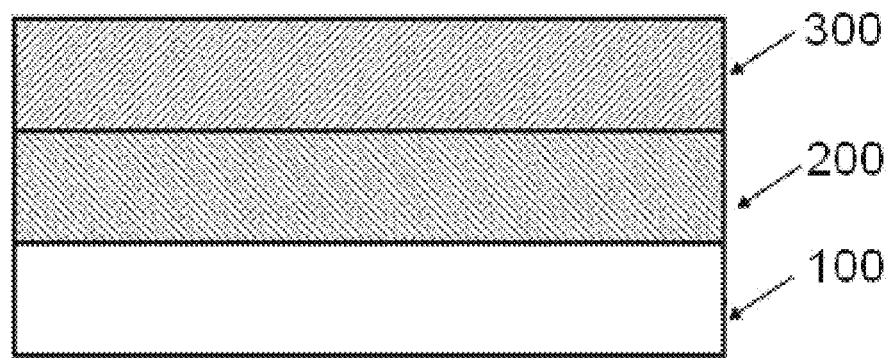
FIGS. 1 to 3 are views illustrating a laminate structure of a conductive structure body including a darkening layer as an exemplary embodiment of the present application.

Hereinafter, the present application will be described in more detail.

In the present specification, a display device refers to all monitors for a TV or a computer, and includes a display element forming an image and a case supporting the display element.

Examples of the display element may include a plasma display panel (PDP), a liquid crystal display (LCD), an electrophoretic display, a cathode-ray tube (CRT), an OLED display, and the like. An RGB pixel pattern for implementing an image and an additional optical filter may be provided in the display element.

Meanwhile, in connection with a display device, as the spread of smart phones, tablet PCs, and IPTVs is accelerated, a demand for a touch function that uses human hands as a direct input device without a separate input device such as keyboards or remote controllers is growing. In addition, a multi-touch function for recognizing a specific point and taking notes is also required.

Currently, most commercially available touch screen panels (TSP) are based on a transparent conductive ITO thin film, but have problems in that a touch recognition speed is decreased and an additional compensation chip for overcoming the decrease of the touch recognition speed should be introduced because of a RC delay due to relatively high surface resistance of the ITO transparent electrode (minimum 150 Ω/square, ELECRYSTA products manufactured by Nitto Denko Co., Ltd.) when a touch screen panel having a large area is applied.

The inventors of the present application have studied a technology for replacing the transparent ITO thin film by a metal fine pattern. In this regard, the inventors of the present application found that in the case where Ag, Mo/Al/Mo, MoTi/Cu, and the like, which are metal thin films having high electric conductivity, are used as an electrode of a touch screen panel, when a fine electrode pattern having a predetermined shape is to be implemented, there is a problem in that the pattern is easily recognized by the human eye in view of visibility due to high reflectance, and glaring and the like may occur due to high reflectance and haze value to external light. In addition, the present inventors found that a costly target is used during the manufacturing process or there are many cases where the process is complicated.

Accordingly, an exemplary embodiment of the present application provides a conductive structure body that may be applied to a touch screen panel that may be differentiated from a known touch screen panel using an ITO-based transparent conductive thin film layer and has an improved concealing property of a metal fine pattern electrode and improved reflection and diffraction properties to external light.

In the present specification, a darkening layer may be a patterned darkening layer or a darkening pattern layer. Further, in the present specification, a conductive layer may be a patterned conductive layer or a conductive pattern layer.

The conductive structure body according to the exemplary embodiment of the present application may include the darkening layer satisfying the following Equations 1 and 2 to light having at least one wavelength of light having the wavelength of 550 nm to 650 nm.

$$|R| = \left| \frac{1}{(n+1)^2 + k^2} \left[ \{(n-1)^2 + k^2\} - 4nR_{Metal} \exp\left(-\frac{2\pi}{n}k\right) \right] \right| \leq 0.2 \quad \text{[Equation 1]}$$

In Equation 1,
|R| is a parameter for reducing visibility of the conductive structure body,
n is a refractive index, k is an extinction coefficient, $R_{Metal}$ is a reflectance of the conductive layer,
λ is the wavelength of light.

$$d = \frac{\lambda}{4n} N (N = 1, 3, 5, \ldots) \quad \text{[Equation 2]}$$

In Equation 2,
d is a thickness of the darkening layer, n is a refractive index, and λ is the wavelength of light.
N means a constant under an extinction interference condition.
In Equation 1, n and k may be n>0, and k>0.
In Equation 2, n and k may be n>0, and k>0.
When the material satisfies the range of Equation 1, a material which may constitute a darkened layer may be determined according to n, k, and $R_{metal}$, and a predetermined composition ratio of the material may be determined.

Furthermore, when the material satisfies the range of Equation 2, it is possible to determine an appropriate thickness of the darkened layer which varies depending on the material of the darkened layer.

That is, in the conductive structure body according to an exemplary embodiment of the present application, it is possible to determine a material which constitutes the darkened layer, a predetermined composition ratio of the material, and a thickness of the darkened layer according to n and k.

The parameter |R| for reducing visibility of the conductive structure body of Equation 1 may be represented by $|R_1-R_2|$ of Equation 4, and Equation 1 may satisfy the following Equation 4.

$$|R_1 - R_2| = \left| \frac{1}{(n+1)^2 + k^2} \left[ \{(n-1)^2 + k^2\} - 4nR_{Metal} \exp\left(-\frac{2\pi}{n}k\right) \right] \right| \leq 0.2 \quad \text{[Equation 4]}$$

In Equation 4,
$R_1$ is first reflectance of the darkening layer, and $R_2$ is second reflectance of the darkening layer.

The conductive structure body according to the exemplary embodiment of the present application may satisfy a difference between the first reflectance and the second reflectance of the darkening layer of 0.2 or less.

The first reflectance $R_1$ of a material where the refractive index is $\tilde{n} = n - ik$ ($n > 0$ and $k > 0$) is represented by the following Equation 5.

$$R_1 = \frac{(n-1)^2 + k^2}{(n+1)^2 + k^2} \qquad \text{[Equation 5]}$$

In addition, the second reflectance $R_2$ of the darkening layer is represented by the following Equation 6.

$$R_2 = R_{Metal}(1 - R_1)\exp\left(-\frac{8\pi}{\lambda}k\frac{\lambda}{4n}N\right) \qquad \text{[Equation 6]}$$

When light having the intensity of $I_0$ is applied to the darkening layer, a portion thereof is first reflected on the surface of the darkening layer, and the other light passes through the inside of the darkening layer. In this case, the first reflectance of the surface of the darkening layer is $R_1$, and the intensity of first reflected light is $R_1I_0$. In addition, the second reflectance of the surface of the darkening layer is $R_2$, and the intensity of second reflected light is $R_2I_0$.

Further, a portion of the other light is first absorbed in the darkening layer, and another one passes through the darkening layer to reach the different adjacent layer. In this case, in the case where the thickness of the darkening layer is d, the intensity of light passing through the darkening layer having the thickness of d and then reaching the surface of the conductive layer is represented by the following Equation 7. In the following Equation 7, $\alpha$ is a linear absorption coefficient, d is the thickness of the darkening layer, k is an extinction coefficient, and $\lambda$ is a wavelength of light.

Intensity of light reaching the surface of the conductive layer=$(1-R_1)I_0\exp(-\alpha d)$ [Equation 7]

In Equation 7, the linear absorption coefficient $\alpha$ is represented by the following Equation 8.

$$\alpha = \frac{4\pi}{\lambda}k \qquad \text{[Equation 8]}$$

In addition, a portion of light passing through the darkening layer having the thickness of d is reflected on the layer adjacent to the darkening layer, specifically on the surface of the conductive layer in a direction of the darkening layer, and in this case, the intensity of light reflected on the surface of the conductive layer is represented by the following Equation 9. Herein, $R_{Metal}$ means reflectance of the conductive layer.

Intensity of light reflected on the surface of the [Equation 9]

conductive layer = $R_{Metal}(1 - R_1)I_0\exp\left(-\frac{4\pi k}{\lambda}d\right)$ A portion of reflected light represented by Equation 9 is second absorbed while passing through the darkening layer, and the remaining portion thereof is reflected to the surface of the darkening layer. In this case, reflected light is light second reflected on the darkening layer, and in this case, second reflectance is $R_2$ represented by Equation 6. Further, the intensity $R_2I_0$ of light second reflected on the surface of the darkening layer is represented by the following Equation 10.

$$R_2I_0 = R_{Metal}(1 - R_1)I_0\exp\left(-\frac{8\pi}{\lambda}k\frac{\lambda}{4n}N\right) \qquad \text{[Equation 10]}$$

Figure 7:
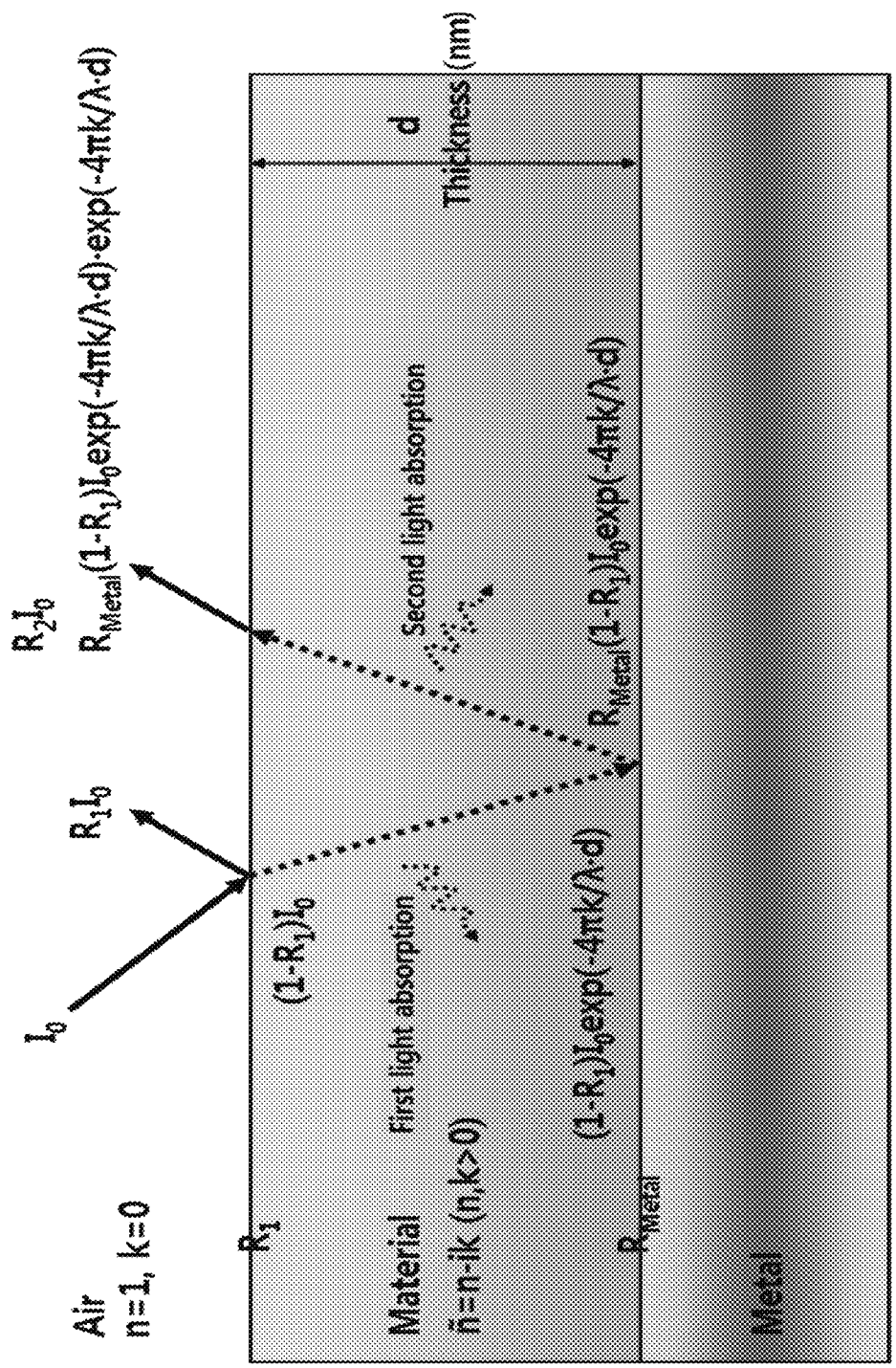
FIG. 7 illustrates the intensity of light first reflected on a surface of the darkening layer, the intensity of light second reflected on the surface of the darkening layer, the intensity of light first reaching the surface of a conductive layer, and the intensity of light reflected on the surface of the conductive layer when the intensity of light is $I_0$ as the exemplary embodiment of the present application.

FIG. 7 illustrates the intensity of light first reflected on the surface of the darkening layer, the intensity of light second reflected on the surface of the darkening layer represented by Equation 10, the intensity of light reaching the surface of the conductive layer represented by Equation 7, and the intensity of light reflected on the surface of the conductive layer represented by Equation 9 when the intensity of light is $I_0$.

The thickness d of the darkening layer represented by Equation 2 is a relationship equation under the extinction interference condition where first reflection and second reflection wavelengths on the surface of the darkening layer have a phase difference of 180°.

The conductive structure body according to the exemplary embodiment of the present application may further include a substrate and a conductive layer. Herein, the darkening layer may be provided on any one surface of the conductive layer, or both surfaces of the conductive layer.

The conductive structure body according to the exemplary embodiment of the present application may include a substrate; a conductive layer provided on the substrate; and a darkening layer provided on the conductive layer.

The conductive structure body according to the exemplary embodiment of the present application may include a substrate; a darkening layer provided on the substrate; and a conductive layer provided on the darkening layer.

The conductive structure body according to the exemplary embodiment of the present application may include a substrate; a darkening layer provided on the substrate; a conductive layer provided on the darkening layer; and a darkening layer provided on the conductive layer.

In the exemplary embodiment of the present application, the conductive layer or the darkening layer may be patterned. The conductive layer may be a patterned conductive layer, and the darkening layer may be a patterned darkening layer. The shape of the pattern will be described below.

The inventors of the present application found the fact that light reflection and diffraction properties by the patterned layers significantly affect visibility of the conductive metal fine pattern in a touch screen panel including the conductive metal fine pattern provided in an effective screen portion, and attempted to improve this. Specifically, a problem caused by the reflectance of the conductive pattern due to high transmittance of the ITO was not serious in a known ITO-based touch screen panel, but it was found that reflectance and darkening properties of the conductive metal fine pattern were important in the touch screen panel including the conductive metal fine pattern provided in the effective screen portion.

The darkening layer may be introduced in order to decrease the reflectance of the conductive metal fine pattern and improve the absorbance property in the touch screen panel according to the exemplary embodiment of the present application. The darkening layer may be provided on at least one surface of the conductive layer in the touch screen panel to largely prevent a decrease in visibility according to high reflectance of the conductive layer.

Specifically, since the darkening layer has light absorptivity, the reflectance by the conductive layer may be decreased by decreasing the quantity of light that is incident on the conductive layer and the quantity of light that is reflected from the conductive layer. In addition, the darkening layer may have low reflectance as compared to that of the conductive layer. Thereby, the reflectance of light may be decreased as compared to the case where the user directly observes the conductive layer, and thus visibility of the conductive layer may be largely improved.

In the present specification, the darkening layer means a layer having absorbance to reduce the quantity of light that is incident on the conductive layer itself and the quantity of light that is reflected from the conductive layer, may be the patterned darkening layer, and may be represented by terms such as an absorbance layer, a blackened layer, and a blackening layer, and the patterned darkening layer may be represented by terms such as a patterned absorbance layer, a patterned blackened layer, and a patterned blackening layer.

In the exemplary embodiment of the present application, the conductive structure body including the patterned conductive layer and the patterned darkening layer may have surface resistance of 1 Ω/square or more and 300 Ω/square or less, specifically 1 Ω/square or more and 100 Ω/square or less, more specifically 1 Ω/square or more and 50 Ω/square or less, and even more specifically 1 Ω/square or more and 20 Ω/square or less.

If the surface resistance of the conductive structure body is 1 Ω/square or more and 300 Ω/square or less, there is an effect of replacing a known ITO transparent electrode. In the case where the surface resistance of the conductive structure body is 1 Ω/square or more and 100 Ω/square or less or 1 Ω/square or more and 50 Ω/square or less, and particularly, in the case where the surface resistance is 1 Ω/square or more and 20 Ω/square or less, since the surface resistance is significantly low as compared to the case where the known ITO transparent electrode is used, there are advantages in that a RC delay is reduced when a signal is applied to significantly improve a touch recognition speed, and accordingly, a touch screen having a large area of 10 inches or more may be easily applied.

In the conductive structure body, the surface resistance of the conductive layer or the darkening layer before patterning may be more than 0 Ω/square and 2 Ω/square or less, and specifically, more than 0 Ω/square and 0.7 Ω/square or less. If the surface resistance is 2 Ω/square or less, and particularly 0.7 Ω/square or less, designing of fine patterning and a manufacturing process are easily performed as the surface resistance of the conductive layer or the darkening layer before patterning is decreased, and there is an effect that a response speed of the electrode is increased by decreasing the surface resistance of the conductive structure body after patterning. The surface resistance may be adjusted according to the thickness of the conductive layer or the darkening layer.

In the conductive structure body according to the exemplary embodiment of the present application, the extinction coefficient k of the darkening layer may be 0.2 to 2.5, specifically 0.2 to 1.2, and more specifically 0.4 to 1 or 0.4 to 0.8.

If the extinction coefficient k is 0.2 or more, there is an effect facilitating darkening. The extinction coefficient k may be called an absorption coefficient, and is an index defining how strong the conductive structure body absorbs light at a predetermined wavelength and a factor determining transmittance of the conductive structure body. For example, in the case of a transparent dielectric material, k<0.2, which is very low. However, as the amount of metal components in the material is increased, the k value is increased. If the amount of metal components is more increased, transmission hardly occurs, mostly, only surface reflection occurs on the metal, and the extinction coefficient k is more than 2.5, which is not preferable in formation of the darkening layer.

In the case where the extinction coefficient k is 0.2 to 1.2, when Equation 1 is satisfied, the parameter |R| for reducing visuality of the conductive structure body is further decreased, and thus there is an effect further increasing the degree of darkening of the darkening layer. Specifically, the aforementioned case corresponds to the case where a percentage of the parameter according to Equation 1 is 20% or less or a value of the parameter according to Equation 3 is 51.8 or less. Alternatively, the aforementioned case corresponds to the case where an average percentage of the parameter for reducing visuality of the conductive structure body in a visible ray wavelength region, specifically a wavelength region of 300 nm to 800 nm, and more specifically a wavelength region of 380 nm to 780 nm is 20%. In this case, a concealing property of the conductive layer may be improved, and visibility may be improved when the conductive layer is applied to the touch screen panel.

In the case where the extinction coefficient k is 0.4 to 1, when Equation 1 is satisfied, the parameter |R| for reducing visuality of the conductive structure body is further decreased, and thus there is an effect further increasing the degree of darkening of the darkening layer. Specifically, the aforementioned case corresponds to the case where a percentage of the parameter according to Equation 1 is about 12% or less or a value of the parameter according to Equation 3 is about 40 or less. Alternatively, the aforementioned case corresponds to the case where an average percentage of the parameter for reducing visuality of conductive structure body in a visible ray wavelength region, specifically a wavelength region of 300 nm to 800 nm, and more specifically, a wavelength region of 380 nm to 780 nm is about 15%. In this case, a concealing property of the conductive layer may be further improved, and visibility may be further improved when the conductive layer is applied to the touch screen panel.

In the exemplary embodiment of the present application, the refractive index n of the conductive structure body may be more than 0 to 3 or less.

In the description regarding the parameter |R| for reducing visuality of the following conductive structure body or reflectance of the darkening layer, the darkening layer may be the patterned darkening layer, and the conductive layer may be the patterned conductive layer.

In the present specification, the parameter |R| for reducing visuality of the conductive structure body of Equation 1 may be represented by $|R_1-R_2|$ of Equation 4. Further, |R| may mean reflectance of light having at least one wavelength of light having the wavelength of 550 nm to 650 nm, which is incident on a surface to be measured at 90°, after an opposite surface of the surface to be measured is treated by a black layer (perfect black). In the case where the value of Equation 1 to light having at least one wavelength of light having the wavelength of 550 nm to 650 nm is 0.2 or less, the parameter |R| for reducing the visuality of the conductive structure body even in an entire wavelength region of visible rays, specifically a wavelength of 300 nm to 800 nm, and more specifically a wavelength of 380 nm to 780 nm may be 0.2 or less.

More specifically, |R| may mean reflectance of light having the wavelength of 600 nm, which is incident on the surface to be measured at 90°, after the opposite surface of the surface to be measured is treated by the black layer (perfect black). In the case where the value of Equation 1 to light having the wavelength of 600 nm is 0.2 or less, the parameter |R| for reducing visuality of the conductive structure body even in an entire wavelength region of visible rays, specifically a wavelength of 300 nm to 800 nm, and more specifically a wavelength of 380 nm to 780 nm may be 0.2 or less.

In the exemplary embodiment of the present application, the parameter |R| for reducing visuality of the conductive structure body represented by Equation 1 may be 0.2 or less, specifically 0.15 or less, more specifically 0.1 or less, even more specifically 0.07 or less, or 0.03 or less. The effect is increased as |R| is decreased.

In the exemplary embodiment of the present application, the percentage of the parameter |R| for reducing visuality of the conductive structure body represented by Equation 1 may be 20% or less, specifically 15% or less, more specifically 10% or less, even more specifically 7% or less, or 3% or less. The effect is increased as the percentage of |R| is decreased.

The parameter |R| for reducing visuality of the conductive structure body may be measured in a direction of an opposite surface of a surface of the darkening layer in contact with the conductive layer while the conductive layer is provided between the substrate and the darkening layer. Specifically, when the darkening layer includes a first surface that is in contact with the conductive layer and a second surface facing the first surface, the measurement may be performed in a direction of two surfaces. When the measurement is performed in this direction, the parameter |R| for reducing visuality of the conductive structure body may be 0.2 or less, specifically 0.15 or less, more specifically 0.1 or less, even more specifically 0.07 or less, or 0.03 or less. The effect is increased as |R| is decreased.

In addition, the darkening layer may be provided between the conductive layer and the substrate, and measured in a substrate side. When |R| is measured in the substrate side, |R| may be 0.2 or less, specifically 0.15 or less, more specifically 0.1 or less, even more specifically 0.07 or less, or 0.03 or less. The effect is increased as |R| is decreased.

In the exemplary embodiment of the present application, in the conductive structure body, reflectance of the darkening layer may be 0.2 or less, specifically 0.15 or less, more specifically 0.1 or less, even more specifically 0.07 or less, or 0.03 or less. The effect is further increased as the reflectance is decreased.

In the exemplary embodiment of the present application, in the conductive structure body, the percentage of reflectance of the darkening layer may be 20% or less, specifically 15% or less, more specifically 10% or less, even more specifically 7% or less, or 3% or less. The effect is further increased as the reflectance is decreased.

In the present specification, when incident light is 100%, reflectance may be a value measured based on the wavelength value of 300 nm to 800 nm, specifically 380 nm to 780 nm, and more specifically 550 nm to 600 nm of light reflected by a target pattern layer or the conductive structure body on which light is incident.

In the conductive structure body according to the exemplary embodiment of the present application, the darkening layer may include a first surface that is in contact with the conductive layer and a second surface facing the first surface. In this case, when the reflectance of the conductive structure body is measured at a side of the second surface of the darkening layer, the reflectance (Rt) of the conductive structure body may be calculated by the following Equation 11.

Reflectance ($Rt$)=reflectance of the substrate+closure ratio×reflectance of the darkening layer    [Equation 11]

In addition, in the case where the conductive structure body has a constitution in which two kinds of conductive structure bodies are laminated, the reflectance (Rt) of the conductive structure body may be calculated by the following Equation 12.

Reflectance ($Rt$)=reflectance of the substrate+closure ratio×reflectance of the darkening layer×2    [Equation 12]

In Equations 11 and 12, the reflectance of the substrate may be reflectance of a touch reinforced glass, and in the case where the surface is a film, the reflectance of the substrate may be reflectance of the film.

In addition, the closure ratio may be represented by an area ratio of a region covered by the conductive pattern, that is, (1−opening ratio), based on a plane of the conductive structure body.

Accordingly, a difference between the case where there is the patterned darkening layer and the case where there is no patterned darkening layer depends on the reflectance of the patterned darkening layer. In this regard, the reflectance (Rt) of the conductive structure body according to the exemplary embodiment of the present application may be decreased by 10 to 20%, 20 to 30%, 30 to 40%, 40 to 50%, or 50 to 70% as compared to the reflectance (R0) of the conductive structure body having the same constitution, except that there is no patterned darkening layer. That is, in the case where in Equations 11 and 12, the closure ratio range is changed from 1 to 10% and the reflectance range is changed within a range of from 1 to 30%, the maximum reflectance decrease effect of 70% may be exhibited, and the minimum reflectance decrease effect of 10% may be exhibited.

In the conductive structure body according to the exemplary embodiment of the present application, the patterned darkening layer includes a first surface that is in contact with the conductive pattern and a second surface facing the first surface, and when the reflectance of the conductive structure body is measured at a side of the second surface of the darkening pattern, a difference between the reflectance (Rt) of the conductive structure body and the reflectance (R0) of the substrate may be 40% or less, 30% or less, 20% or less, or 10% or less.

In the exemplary embodiment of the present application, the thickness of the darkening layer may satisfy Equation 2. Specifically, the thickness of the darkening layer may be 20 nm to 150 nm. The preferable thickness of the darkening layer may vary according to the refractive index of the used material and a manufacturing process, but in consideration of an etching property, if the thickness is 20 nm or more, it is relatively easy to adjust the process, and if the thickness is 150 nm or less, the thickness may be relatively advantageous in view of a production speed. Since it is easy to adjust the process and the production speed is improved within the aforementioned thickness range, the aforementioned thickness range may be more advantageous in the manufacturing process. In this case, reflectance is further decreased to form the darkening layer better, and thus there is a more advantageous effect.

The conductive structure body according to the exemplary embodiment of the present application may include the darkening layer satisfying the value of the following Equation 3 of 51.8 or less. More specifically, the conductive structure body may include the darkening layer satisfying the value of the following Equation 3 of 40 or less.

$$A^* = 116 \times \left\{ \left| \frac{1}{(n+1)^2 + k^2} \left[ \{(n-1)^2 + k^2\} - 4n \cdot R_{Metal} \exp\left(-\frac{2\pi}{n} \cdot k\right) \right] \right|^{\frac{1}{3}} \right\} - 16 \quad \text{[Equation 3]}$$

In Equation 3,

A* is a parameter representing brightness to a predetermined wavelength, and n, k, and $R_{Metal}$ are the same as definitions of Equation 1. For example, A* may be a parameter representing brightness to light having at least one wavelength of light having the wavelength of 550 nm to 650 nm, and more specifically a parameter representing brightness to light having the wavelength of 600 nm.

$$L^* = 116 \times f\left(\frac{Y}{Y_n}\right) - 16 \quad \text{[Equation 13]}$$

L* is a parameter representing brightness to an entire wavelength region of visible rays, and represents specifically a brightness value based on a CIE (Commission Internationale de l'Eclairage) L*a*b* color coordinate.

$$f(t) = t^{\frac{1}{3}}\left(t > \left(\frac{6}{29}\right)^3\right) \quad \text{[Equation 14]}$$

In the case of Equation 13, when reflectance of the darkening layer is 0.9% or more, since the following Equation 14 is satisfied, L* may satisfy the following Equation 15.

$$L^* = 116 \times \left(\frac{Y}{Y_n}\right)^{\frac{1}{3}} - 16 \quad \text{[Equation 15]}$$

Y means a stimulus value corresponding to a green color of tri stimulus values of a CIE XYZ coordinate system, and satisfies the following Equation 16. Further, Yn means a normalized value of the stimulus value corresponding to a white color of the tri stimulus values of the CIE XYZ coordinate system, and satisfies the following Equation 17.

$$Y = \int R(\lambda)s(\lambda)y(\lambda)d\lambda \quad \text{[Equation 16]}$$

$$Y_n = \int s(\lambda)y(\lambda)d\lambda t \quad \text{[Equation 17]}$$

In Equation 16 or 17, R means a parameter for reducing visuality of the conductive structure body, S means an output distribution function of a spectrum, and y means a color matching function in which a reaction to the tri stimulus values is numerically described.

In Equations 15 to 17, assuming that the parameter for reducing visuality of the conductive structure body is constant regardless of the wavelength, since (Y/Yn) is the same as R, the parameter A* representing brightness to a predetermined wavelength satisfies Equation 3.

The parameter |R| for reducing visuality of the conductive structure body is decreased as the parameter A* representing brightness to a predetermined wavelength is decreased, and thus there is an advantageous effect. For example, if the parameter A* representing brightness to the wavelength of 600 nm is 51.8 or less, the average percentage of the parameter for reducing visuality of the conductive structure body at a visible ray wavelength region, specifically a wavelength region of 300 nm to 800 nm, and more specifically a wavelength region of 380 nm to 780 nm may be 20% or less. In this case, if A* is 40 or less, the average percentage of the parameter for reducing visuality of the conductive structure body at a visible ray wavelength region, specifically a wavelength region of 300 nm to 800 nm, and more specifically a wavelength region of 380 nm to 780 nm may be further reduced to about 15% or less. In this case, a concealing property of the conductive layer may be further improved, and visibility may be further improved when the conductive layer is applied to the touch screen panel.

In the exemplary embodiment of the present application, a pin hole may be hardly present in the conductive structure body, and even though the pin hole is present, a diameter thereof may be 3 μm or less, and more specifically 1 μm or less. In the case where the diameter of the pin hole in the conductive structure body is 3 μm or less, occurrence of a short circuit may be prevented. Further, in the case where the pin holes are hardly present in the conductive structure body and the number thereof is very small, occurrence of the short circuit may be prevented.

In the exemplary embodiment of the present application, the darkening layer may be provided on at least one surface of the conductive layer. Specifically, the darkening layer may be provided on only any one surface of the conductive layer, or both surfaces thereof.

In the exemplary embodiment of the present application, the darkening layer and the conductive layer may be simultaneously or separately patterned.

In the exemplary embodiment of the present application, the patterned darkening layer and the patterned conductive layer may form a laminate structure by a simultaneous or separate patterning process. In this regard, the laminate structure may be differentiated from a structure where at least a portion of a light absorption material is incorporated or dispersed in the conductive pattern, or a structure where a portion at a surface side of the conductive pattern of the single layer is physically or chemically modified by an additional surface treatment.

In addition, in the conductive structure body according to the exemplary embodiment of the present application, the darkening layer may be directly provided on the substrate or the conductive layer while an attachment layer or adhesive layer is not interposed therebetween. The attachment layer or adhesive layer may affect durability or optical properties. In addition, a method for manufacturing the conductive structure body according to the exemplary embodiment of the present application is significantly different from that of the case where the attachment layer or adhesive layer is used. Moreover, in the exemplary embodiment of the present application, an interface property between the substrate or conductive layer and the darkening layer is excellent as compared to the case where the attachment layer or adhesive layer is used.

In the exemplary embodiment of the present application, the darkening layer may be formed of a single layer, or a plurality of layers of two or more layers.

In the exemplary embodiment of the present application, it is preferable that the darkening layer have an achromatic color. In this case, the achromatic color means a color exhibited when light that is incident on a surface of a body is not selectively absorbed but reflected and absorbed uniformly to a wavelength of each component.

In the exemplary embodiment of the present application, the material of the darkening layer may be used without a particular limitation as long as the material satisfies Equations 1 to 3. For example, in a color filter, materials used as a material of a black matrix may be used. Further, a material having an antireflection function may be used.

For example, the darkening layer may include one or two or more selected from the group consisting of metal, oxides thereof, nitrides thereof, oxynitrides thereof, and carbides thereof. Oxides, nitrides, oxynitrides, or carbides of the metal may be formed by a deposition condition set by the person with ordinary skill in the art and the like. The metal may be one or two or more selected from the group consisting of nickel (Ni), vanadium (V), tungsten (W), tantalum (Ta), molybdenum (Mo), niobium (Nb), titanium (Ti), iron (Fe), chrome (Cr), cobalt (Co), aluminum (Al), and copper (Cu).

As a specific example thereof, the darkening layer may include both Ni and Mo. The darkening layer may include 50 atom % to 98 atom % of Ni and 2 atom % to 50 atom % of Mo, and may further include 0.01 atom % to 10 atom % of other metals, for example, atoms such as Fe, Ta, and Ti. Herein, the darkening layer, if necessary, may further include 0.01 atom % to 30 atom % of nitrogen or 4 atom % or less of oxygen and carbon.

As another specific example thereof, the darkening layer may include at least one of the dielectric material and metal. The aforementioned metal may be metal or a metal alloy. Specifically, the darkening layer may further include the dielectric material selected from $TiO_{2-x}$, $SiO_{2-x}$, $MgF_{2-x}$ and $SiN_{1.3-x}$ ($-1 \leq x \leq 1$), and metal selected from iron (Fe), cobalt (Co), titanium (Ti), vanadium (V), aluminum (Al), molybdenum (Mo), copper (Cu), gold (Au), and silver (Ag), and further include an alloy of two or more metals selected from iron (Fe), cobalt (Co), titanium (Ti), vanadium (V), aluminum (Al), molybdenum (Mo), copper (Cu), gold (Au), and silver (Ag).

According to the exemplary embodiment of the present application, the darkening layer may include one or two or more selected from the group consisting of oxides of metal, nitrides of metal, oxynitrides of metal, and carbides of metal, and may further include at least one of the dielectric material and a metal.

It is preferable that the dielectric material is distributed in an amount gradually decreased as external light goes away in an incident direction, and the metal and alloy component are distributed on the contrary. In this case, it is preferable that the content of the dielectric material is 20 wt % to 50 wt % and the content of the metal is 50 wt % to 80 wt %. In the case where the darkening layer further includes the alloy, it is preferable that the darkening layer includes 10 wt % to 30 wt % of the dielectric material, 50 wt % to 80 wt % of the metal, and 5 wt % to 40 wt % of the alloy.

As another specific example thereof, the darkening layer may be formed of a thin film including an alloy of nickel and vanadium and one or more of oxide, nitride, and oxynitride of nickel and vanadium. In this case, it is preferable that vanadium is included in a content of 26 atom % to 52 atom %, and it is preferable that an atomic ratio of vanadium to nickel is 26/74 to 52/48.

As another specific example thereof, the darkening layer may include a transition layer in which two or more elements are included and a composition ratio of one element is increased by about maximum 20% per 100 angstrom according to an incident direction of external light. In this case, one element may be a metal element such as nickel (Ni), vanadium (V), tungsten (W), tantalum (Ta), molybdenum (Mo), niobium (Nb), titanium (Ti), iron (Fe), chrome (Cr), cobalt (Co), aluminum (Al), and copper (Cu), and the element other than the metal element may be oxygen, nitrogen, or carbon.

As another specific example thereof, the darkening layer may include a first chrome oxide layer, a metal layer, a second chrome oxide layer, and a chrome mirror, and in this case, may include metal selected from nickel (Ni), vanadium (V), tungsten (W), tantalum (Ta), molybdenum (Mo), niobium (Nb) titanium (Ti), iron (Fe), cobalt (Co), aluminum (Al), and copper (Cu) instead of chrome. It is preferable that the metal layer has a thickness of 10 nm to 30 nm, the first chrome oxide layer has a thickness of 35 nm to 41 nm, and the second chrome oxide layer has a thickness of 37 nm to 42 nm.

As another specific example thereof, as the darkening layer, a laminate structure of an alumina ($Al_2O_3$) layer, a chrome oxide ($Cr_2O_3$) layer, and a chrome (Cr) layer may be used. Herein, the alumina layer has an improved reflection property and a light diffusion prevention property, and the chrome oxide layer may improve a contrast property by decreasing inclined surface reflectance.

As another specific example thereof, as the darkening layer, a laminate structure formed of aluminum nitride (AlNx) and Al may be used. Herein, the aluminum nitride (AlNx) layer may improve a contrast property by decreasing reflectance of the entire layer.

In the exemplary embodiment of the present application, the darkening layer may be provided on any one surface or both surfaces of the conductive layer. Herein, the darkening layer may have a pattern having the same shape as the conductive layer. However, the pattern size of the patterned darkening layer does not need to be completely the same as that of the patterned conductive layer, and even the case where the line width of the patterned darkening layer is smaller or larger than that of the patterned conductive layer is included in the range of the present application. Specifically, the line width of the pattern in the patterned darkening layer may be 80% to 120% of the line width of the pattern in the patterned conductive layer.

In the exemplary embodiment of the present application, the patterned darkening layer may have a pattern shape having the line width that is smaller or larger than that of the patterned conductive layer. For example, the area of the patterned darkening layer may be 80% to 120% of an area occupied by the patterned conductive layer.

In the exemplary embodiment of the present application, it is preferable that the pattern of the darkening layer be a pattern shape having the line width that is the same as or larger than that of the pattern of the conductive layer.

In the case where the patterned darkening layer has the pattern shape having the larger line width than that of the patterned conductive layer, since an effect in which the patterned darkening layer covers the patterned conductive layer when observed by the user may be more largely increased, there is an advantage in that an effect by gloss or reflection of the patterned conductive layer may be efficiently blocked. However, even though the line width of the pattern in the patterned darkening layer is the same as that of the pattern in the patterned conductive layer, a target effect of the present application can be accomplished.

In the conductive structure body according to the exemplary embodiment of the present application, a transparent board may be used as the substrate, but the substrate is not particularly limited, and for example, glass, a plastic board, a plastic film, and the like may be used.

In the exemplary embodiment of the present application, the thickness of the conductive layer is not particularly limited, but a better effect may be exhibited in terms of electric conductivity of the conductive layer and economic efficiency of the process of forming the pattern when the thickness is 0.01 μm to 10 μm.

In the exemplary embodiment of the present application, the material of the conductive layer is appropriately a material having specific resistance of $1 \times 10^{-6}$ Ω·cm to $30 \times 10^{-6}$ Ω·cm and preferably $1 \times 10^{-6}$ Ω·cm to $7 \times 10^{-6}$ Ω·cm.

In the conductive structure body according to the exemplary embodiment of the present application, it is preferable that the material of the conductive layer include one or two or more selected from the group consisting of metal, a metal alloy, metal oxides, and metal nitrides. It is preferable that the material of the conductive layer be a metal material that has excellent electric conductivity and is easily etched. However, in general, the material having excellent electric conductivity has a disadvantage in that reflectance is high. However, in the present application, it is possible to form the conductive layer using the material having high reflectance by using the darkening layer. In the present application, in the case where the material having reflectance of 70% to 80% or more is used, the darkening layer may be added to decrease the reflectance, improve a concealing property of the conductive layer, and maintain or improve a contrast property.

In the exemplary embodiment of the present application, specific examples of the material of the conductive layer may include one or two or more selected from the group consisting of copper (Cu), aluminum (Al), silver (Ag), neodymium (Nd), molybdenum (Mo), nickel (Ni), oxides thereof, and nitrides thereof. For example, the material may be an alloy of two or more selected from the aforementioned metals. More specifically, molybdenum, aluminum, or copper may be included. The conductive layer may be a single film or a multilayered film.

In the exemplary embodiment of the present application, the line width of the patterned conductive layer may be more than 0 μm and 10 μm or less, specifically 0.1 μm or more and 10 μm or less, more specifically 0.2 μm or more to 8 μm or less, and even more specifically 0.5 μm or more to 5 μm or less.

In the exemplary embodiment of the present application, the opening ratio of the patterned conductive layer, that is, the ratio of the area not covered by the pattern, may be 70% or more, 85% or more, and 95% or more. In addition, the opening ratio of the patterned conductive layer may be 90% to 99.9%, but is not limited thereto.

In the exemplary embodiment of the present application, the pattern of the patterned conductive layer may be a regular pattern or an irregular pattern.

A pattern shape of the art, such as a mesh pattern, may be used as the regular pattern. The irregular pattern is not particularly limited, but may be a boundary line shape of figures constituting a Voronoi diagram. In the present application, in the case where the irregular pattern and the patterned darkening layer are used together, a diffracted pattern of reflected light by lighting having directivity may be removed by the irregular pattern, and an effect of scattering light may be minimized by the patterned darkening layer, such that the problem in visibility may be minimized.

Figure 2:
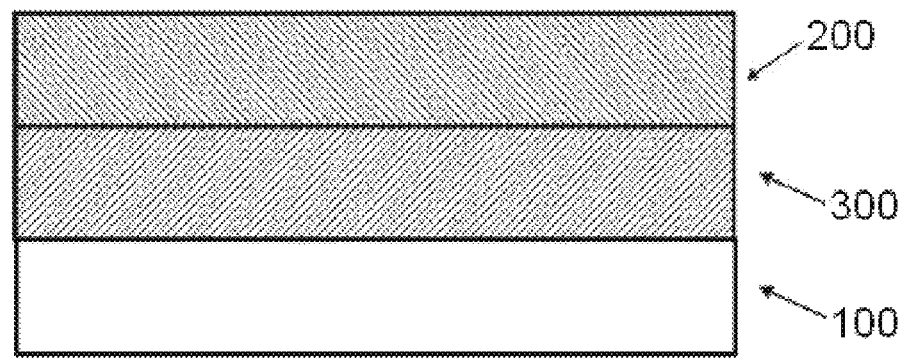
Figure 3:
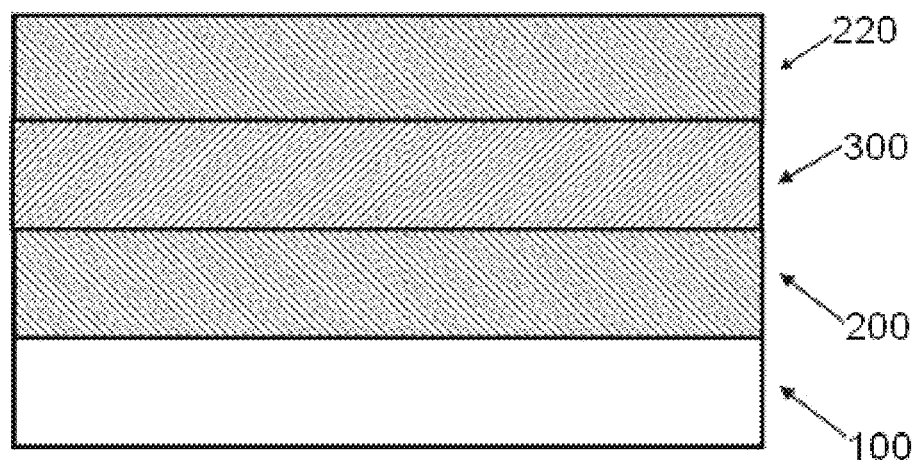

Examples of the conductive structure body according to the exemplary embodiment of the present application are illustrated in the following FIGS. 1 to 3. FIGS. 1 to 3 illustrate the order of lamination of the substrate, the conductive layer, and the darkening layer, and the conductive layer and the darkening layer may not have an entire surface layer form but have a pattern shape when being applied as a fine transparent electrode such as a touch screen panel in practice.

According to FIG. 1, the case where the darkening layer 200 is interposed between the substrate 100 and the conductive layer 300 is illustrated. In the case where the user observes the touch screen panel from the substrate side, reflectance by the conductive layer may be largely decreased.

According to FIG. 2, the case where the darkening layer 200 is disposed on the conductive layer 300 is illustrated. In the case where the user observes the touch screen panel from an opposite surface of the substrate side, reflectance by the conductive layer may be largely decreased.

According to FIG. 3, the case where the darkening layers 200 and 220 are disposed between the substrate 100 and the conductive layer 300 and on the conductive layer 300 is illustrated. In all the case where the user observes the touch screen panel from the substrate side and the case where the user observes the touch screen panel from the opposite side thereof, the reflectance by the conductive layer may be largely decreased.

In the description of FIGS. 1 to 3, the conductive layer may be the patterned conductive layer, and the darkening layer may be the patterned darkening layer.

Figure 4:
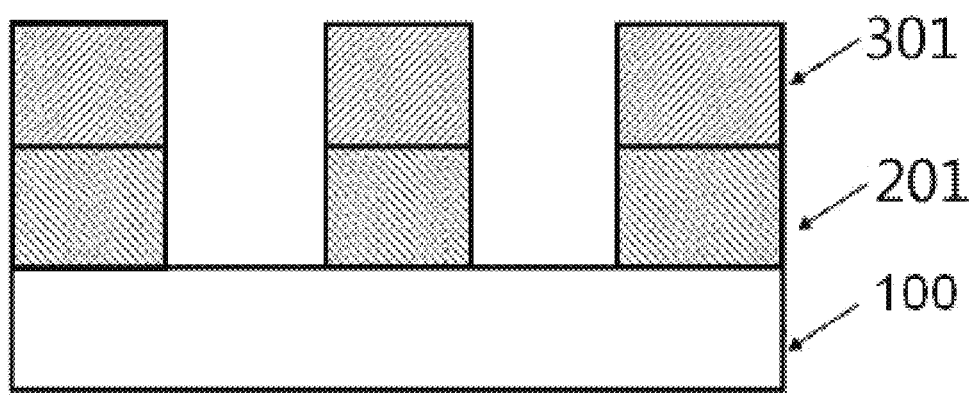
FIGS. 4 to 6 are views illustrating a laminate structure of a conductive structure body including a Conductive pattern layer and a darkening pattern layer as an exemplary embodiment of the present application.
Figure 5:
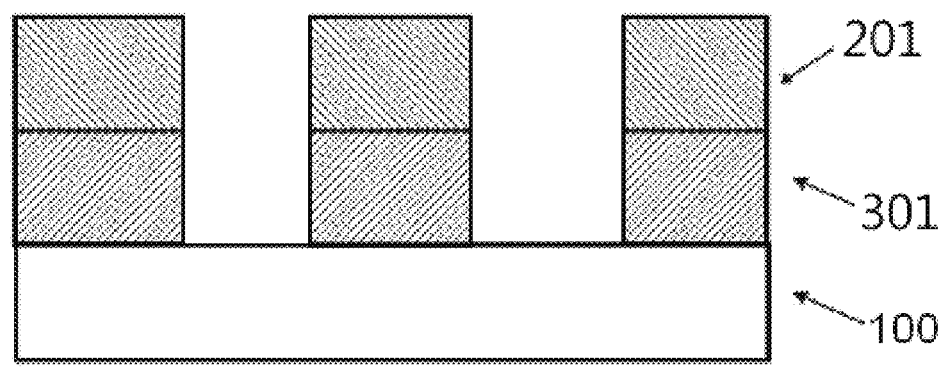
Figure 6:
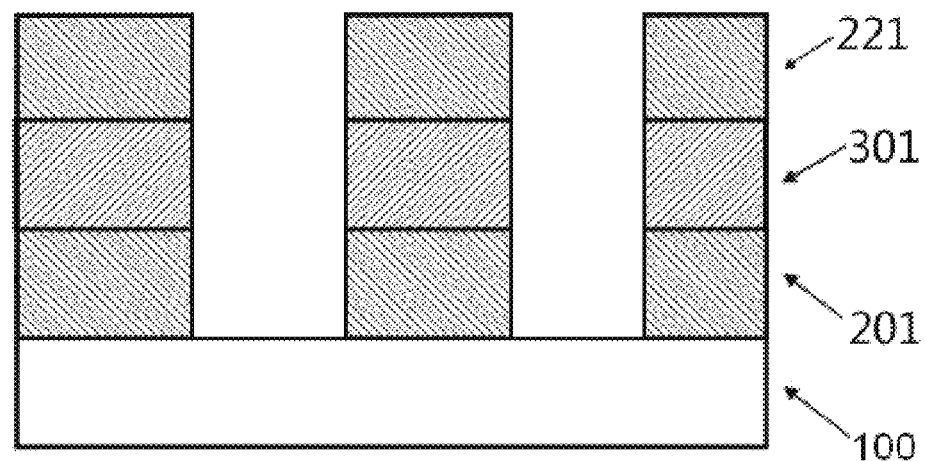

FIGS. 4 to 6 are views illustrating a laminate structure of a conductive structure body including a Conductive pattern layer and a darkening pattern layer as an exemplary embodiment of the present application.

The conductive structure body according to the exemplary embodiment of the present application may have a structure where the darkening layer is provided on at least one surface of the conductive layer.

The structure of the conductive structure body according to the exemplary embodiment of the present application may be a structure where the substrate, the darkening layer, the conductive layer, and the darkening layer are sequentially laminated. In addition, the conductive structure body may include additional conductive and darkening layers on the darkening layer of the outermost portion thereof.

That is, the structure of the conductive structure body according to the exemplary embodiment of the present application may be a structure of substrate/darkening layer/conductive layer, a structure of substrate/conductive layer/darkening layer, a structure of substrate/darkening layer/conductive layer/darkening layer, a structure of substrate/conductive layer/darkening layer/conductive layer, a structure of substrate/darkening layer/conductive layer/darkening layer/conductive layer/darkening layer, a structure of substrate/darkening layer/conductive layer/darkening layer/conductive layer/darkening layer/conductive layer/darkening layer, and the like.

In the aforementioned description, the conductive layer may be a patterned conductive layer, and the darkening layer may be a patterned darkening layer.

A method for manufacturing the conductive structure body according to the exemplary embodiment of the present application includes forming the conductive layer on the substrate; and forming the darkening layer satisfying Equations 1 and 2 to light having at least one wavelength of light having the wavelength of 550 nm to 650 nm, specifically light having the wavelength of 600 nm, before, after, or both before and after the conductive layer is formed.

The method for manufacturing the conductive structure body according to the exemplary embodiment of the present application may further include separately or simultaneously patterning the conductive layer and the darkening layer. The patterning step may be included after the step of forming the darkening layer.

In the exemplary embodiment of the present application, the method for manufacturing the conductive structure body may include forming the darkening layer on the substrate, forming the conductive layer after the darkening layer is formed, forming the darkening layer after the conductive layer is formed, and separately or simultaneously patterning the darkening layer and the conductive layer.

In the method for manufacturing the conductive structure body, the surface resistance of the conductive layer or the darkening layer before patterning may be more than 0 Ω/square and 2 Ω/square or less, and preferably more than 0 Ω/square and 0.7 Ω/square or less. If the surface resistance is 2 Ω/square or less, and particularly 0.7 Ω/square or less, designing of fine patterning and a manufacturing process are easily performed as the surface resistance of the conductive layer or the darkening layer before patterning is decreased, and there is an effect that a response speed of the electrode is increased by decreasing the surface resistance of the conductive structure body after patterning.

A method for manufacturing the conductive structure body according to the exemplary embodiment of the present application includes forming a patterned conductive layer on the substrate; and forming a patterned darkening layer satisfying Equations 1 and 2 to light having at least one wavelength of light having the wavelength of 550 nm to 650 nm, specifically light having the wavelength of 600 nm, before, after, or both before and after the patterned conductive layer is formed.

In the exemplary embodiment of the present application, the method for manufacturing the conductive structure body may include forming a patterned darkening layer on the substrate, and forming a patterned conductive layer after the patterned darkening layer is formed.

In the exemplary embodiment of the present application, the method for manufacturing the conductive structure body may include forming a patterned conductive layer on the substrate, and forming a patterned darkening layer after the patterned conductive layer is formed.

In the exemplary embodiment of the present application, the method for manufacturing the conductive structure body may further include forming a patterned darkening layer on the substrate, forming a patterned conductive layer after the patterned darkening layer is formed, and forming a patterned darkening layer after the patterned conductive layer is formed.

In the exemplary embodiment of the present application, the patterned darkening layer or the darkening layer may satisfy the value of Equation 3 of 51.8 or less and more specifically the value of the following Equation 3 of 40 or less.

In the exemplary embodiment of the present application, in the step of forming the patterned darkening layer or the darkening layer, the patterned darkening layer or the darkening layer may be formed by using a method known in the art. For example, the layer may be formed by a method such as evaporation, sputtering, wet coating, vaporization, electrolytic plating, electroless plating, and lamination of metal foils, and specifically a sputtering method.

For example, when the darkening layer is formed, if a reactive sputtering method is used by using an Al metal target such as AlOxNy (x and y are each a ratio of the numbers of O and N atoms to one atom of Al), the process may be performed by adjusting partial pressure of reactive gas such as $O_2$ and $N_2$.

For example, in the case where the conductive layer including Cu and the darkening layer including CuOx (x is a ratio of the numbers of O atoms to one atom of Cu) are formed, and in the case where inert gas, for example, gas such as Ar is used as sputtering gas, there is an advantage obtained by using a $CuO_x$ single material sputtering target. Therefore, since the $CuO_x$ single material target is used, it is unnecessary to adjust partial pressure of the reactive gas, and thus there are advantages in that it is relatively easy to adjust the process and it is possible to perform batch etching by using a Cu etchant in formation of a final conductive structure body.

In the exemplary embodiment of the present application, the method for forming the patterned conductive layer is not particularly limited, and the patterned conductive layer may be directly formed by a printing method, or a method for patterning the conductive layer after the conductive layer is formed may be used.

In the exemplary embodiment of the present application, in the case where the patterned conductive layer is formed by using the printing method, ink or paste of the conductive material may be used, and the paste may further include a binder resin, a solvent, a glass frit, or the like in addition to the conductive material.

In the case where the conductive layer is patterned after the conductive layer is formed, a material having an etching resist property may be used.

In the exemplary embodiment of the present application, the conductive layer may be formed by a method such as evaporation, sputtering, wet coating, vaporization, electrolytic plating, electroless plating, and lamination of metal foils. A method for applying organic metal, nano metal, or a complex solution thereof on the substrate and then providing conductivity by firing and/or drying may be used as the method for forming the conductive layer. Organic silver may be used as the organic metal, and nano silver particles may be used as the nano metal.

In the exemplary embodiment of the present application, the patterning of the conductive layer may be performed by using a method using an etching resist pattern. The etching resist pattern may be formed by using a printing method, a photolithography method, a photography method, a method using a mask, or laser transferring, for example, thermal transfer imaging, and the printing method or photolithography method is more preferable, but the method is not limited thereto. The conductive thin film layer may be etched and patterned by using the etching resist pattern, and the etching resist pattern may be easily removed by a strip process.

The exemplary embodiment of the present application provides a touch screen panel including the conductive structure body. For example, the conductive structure body according to the exemplary embodiment of the present application may be used as a touch-sensitive type electrode board in a capacitance type touch screen panel.

The exemplary embodiment of the present application provides a display device including the touch screen panel.

The touch screen panel according to the exemplary embodiment of the present application may further include an additional structure body in addition to the aforementioned conductive structure body including the substrate, the patterned conductive layer, and the patterned darkening layer. In this case, two structure bodies may be disposed in the same direction, or two structure bodies may be disposed in directions that are opposite to each other. Two or more structure bodies that may be included in the touch screen panel according to the exemplary embodiment of the present application do not need to have the same structure, and only any one and preferably the structure body that is closest to the user may include the substrate, the patterned conductive layer, and the patterned darkening layer, and the additional structure body may not include the patterned darkening layer. In addition, layer laminate structures in two or more structure bodies may be different from each other. In the case where two or more structure bodies are included, an insulation layer may be interposed therebetween. In this case, the insulation layer may further have a function of an adhesive layer.

The touch screen panel according to the exemplary embodiment of the present application may include a lower substrate; an upper substrate; and an electrode layer provided on any one surface of a surface of the lower substrate that is in contact with the upper substrate and a surface of the upper substrate that is in contact with the lower substrate or both the surfaces. The electrode layer may have X axis and Y axis position detection functions.

In this case, one or two of the electrode layer provided on the lower substrate and the surface of the lower substrate that is in contact with the upper substrate; and the electrode layer provided on the upper substrate and the surface of the upper substrate that is in contact with the lower substrate may be the conductive structure body according to the exemplary embodiment of the present application. In the case where only any one of the electrode layers is the conductive structure body according to the exemplary embodiment of the present application, the other one may have the conductive pattern known in the art.

In the case where the electrode layer is provided on one surface of each of both the upper substrate and the lower substrate to form a double-layered electrode layer, an insulation layer or a spacer may be provided between the lower substrate and the upper substrate so as to constantly maintain an interval between the electrode layers and prevent connection therebetween. The insulation layer may include an adhesive or a UV or heat curable resin. The touch screen panel may further include a ground portion connected to the pattern of the conductive layer of the aforementioned conductive structure bodies. For example, the ground portion may be formed at an edge portion of the surface on which the pattern of the conductive layer of the substrate is formed. Further, at least one of an antireflection film, a polarizing film, and a fingerprint resistant film may be provided on at least one surface of the laminate including the conductive structure body. Other kinds of functional films may be further included in addition to the aforementioned functional films according to the design specification. The touch screen panel may be applied to display devices such as an OLED display panel, a liquid crystal display (LCD), a cathode-ray tube (CRT), and a PDP.

In the touch screen panel according to the exemplary embodiment of the present application, the patterned conductive layer and the patterned darkening layer may be provided on both surfaces of the substrate, respectively.

The touch screen panel according to the exemplary embodiment of the present application may further include an electrode portion or a pad portion on the conductive structure body. In this case, the effective screen portion, the electrode portion, and the pad portion may be formed of the same conductor.

In the touch screen panel according to the exemplary embodiment of the present application, the patterned darkening layer may be provided at a side observed by a user.

The exemplary embodiment of the present application provides a display device including the conductive structure body. In the display device, the conductive structure body according to the exemplary embodiment of the present application may be used in a color filter board, a thin film transistor board, or the like.

The exemplary embodiment of the present application provides a solar battery including the conductive structure body. Examples of the solar battery may include an anode electrode, a cathode electrode, a photokinesis layer, a hole transport layer and/or an electron transport layer, and the conductive structure body according to the exemplary embodiment of the present application may be used as the anode electrode and/or the cathode electrode.

The conductive structure body may be used instead of known ITO in the display device or the solar battery, and may be used to provide flexibility. In addition, the conductive structure body may be used as a next generation transparent electrode in conjunction with CNT, conductive polymers, graphene and the like.

Hereinafter, the present application will be described in detail with reference to the Examples. However, the following Examples are set forth to illustrate the present application, but the range of the present application is not limited thereto.

Example 1

Variables were constituted in a matrix form like the following Table 1, and verification was performed by using the Al lower electrode.

TABLE 1

| | | 150 nm | 125 nm | 107.1 nm | 93.8 nm | 83.3 nm | 75 nm | 68.2 nm | 62.5 nm | 57.5 nm |
|---|---|---|---|---|---|---|---|---|---|---|
| | | | | | | n | | | | |
| k | | 1.0 | 1.2 | 1.4 | 1.6 | 1.8 | 2.0 | 2.2 | 2.4 | 2.6 |
| 0.0 | S1 | | S15 | S29 | S43 | S57 | S71 | S85 | S99 | S113 |
| 0.2 | S2 | | S16 | S30 | S44 | S58 | S72 | S86 | S100 | S114 |
| 0.4 | S3 | | S17 | S31 | S45 | S59 | S73 | S87 | S101 | S115 |
| 0.6 | S4 | | S18 | S32 | S46 | S60 | S74 | S88 | S102 | S116 |
| 0.8 | S5 | | S19 | S33 | S47 | S61 | S75 | S89 | S103 | S117 |
| 1.0 | S6 | | S20 | S34 | S48 | S62 | S76 | S90 | S104 | S118 |
| 1.2 | S7 | | S21 | S35 | S49 | S63 | S77 | S91 | S105 | S119 |
| 1.4 | S8 | | S22 | S36 | S50 | S64 | S78 | S92 | S106 | S120 |
| 1.6 | S9 | | S23 | S37 | S51 | S65 | S79 | S93 | S107 | S121 |

TABLE 1-continued

| | 150 nm | 125 nm | 107.1 nm | 93.8 nm | 83.3 nm | 75 nm | 68.2 nm | 62.5 nm | 57.5 nm |
|---|---|---|---|---|---|---|---|---|---|
| | | | | | n | | | | |
| k | 1.0 | 1.2 | 1.4 | 1.6 | 1.8 | 2.0 | 2.2 | 2.4 | 2.6 |
| 1.8 | S10 | S24 | S38 | S52 | S66 | S80 | S94 | S108 | S122 |
| 2.0 | S11 | S25 | S39 | S53 | S67 | S81 | S95 | S109 | S123 |
| 2.2 | S12 | S26 | S40 | S54 | S68 | S82 | S96 | S110 | S124 |
| 2.4 | S13 | S27 | S41 | S55 | S69 | S83 | S97 | S111 | S125 |
| 2.6 | S14 | S28 | S42 | S56 | S70 | S84 | S98 | S112 | S126 |

Figure 8:
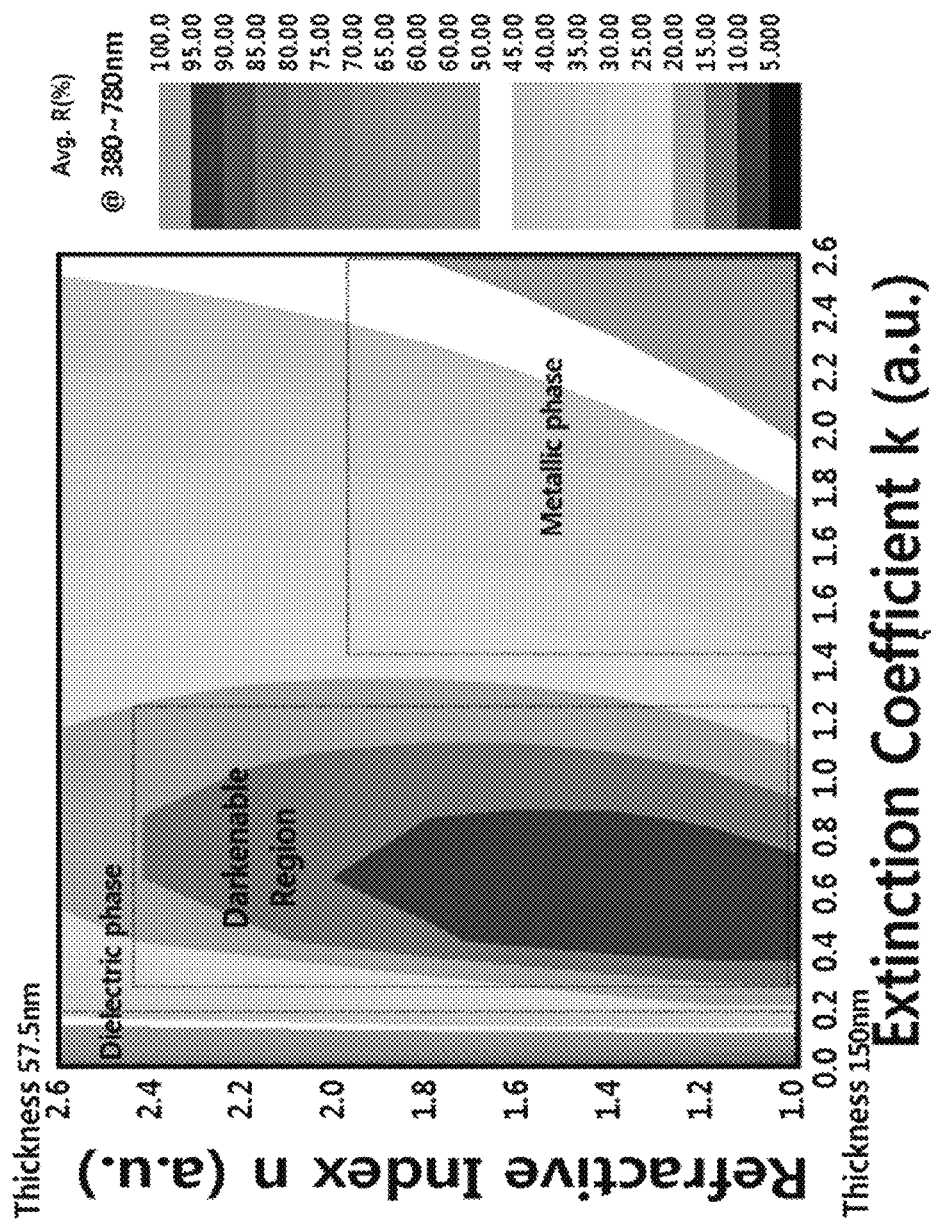
FIG. 8 illustrates a darkenable region when an Al lower electrode is used and the darkening layer including AlOxNy (x>0, y>0) is simulated by using a Macleod program in a wavelength range of 300 nm to 800 nm as the exemplary embodiment of the present application.

FIG. 8 illustrates a blackening (darkenable) region when the Al lower electrode is used and the darkening layer including AlOxNy (x>0, y>0) is simulated by using a Macleod program in a wavelength range of 300 nm to 800 nm.

Figure 9:
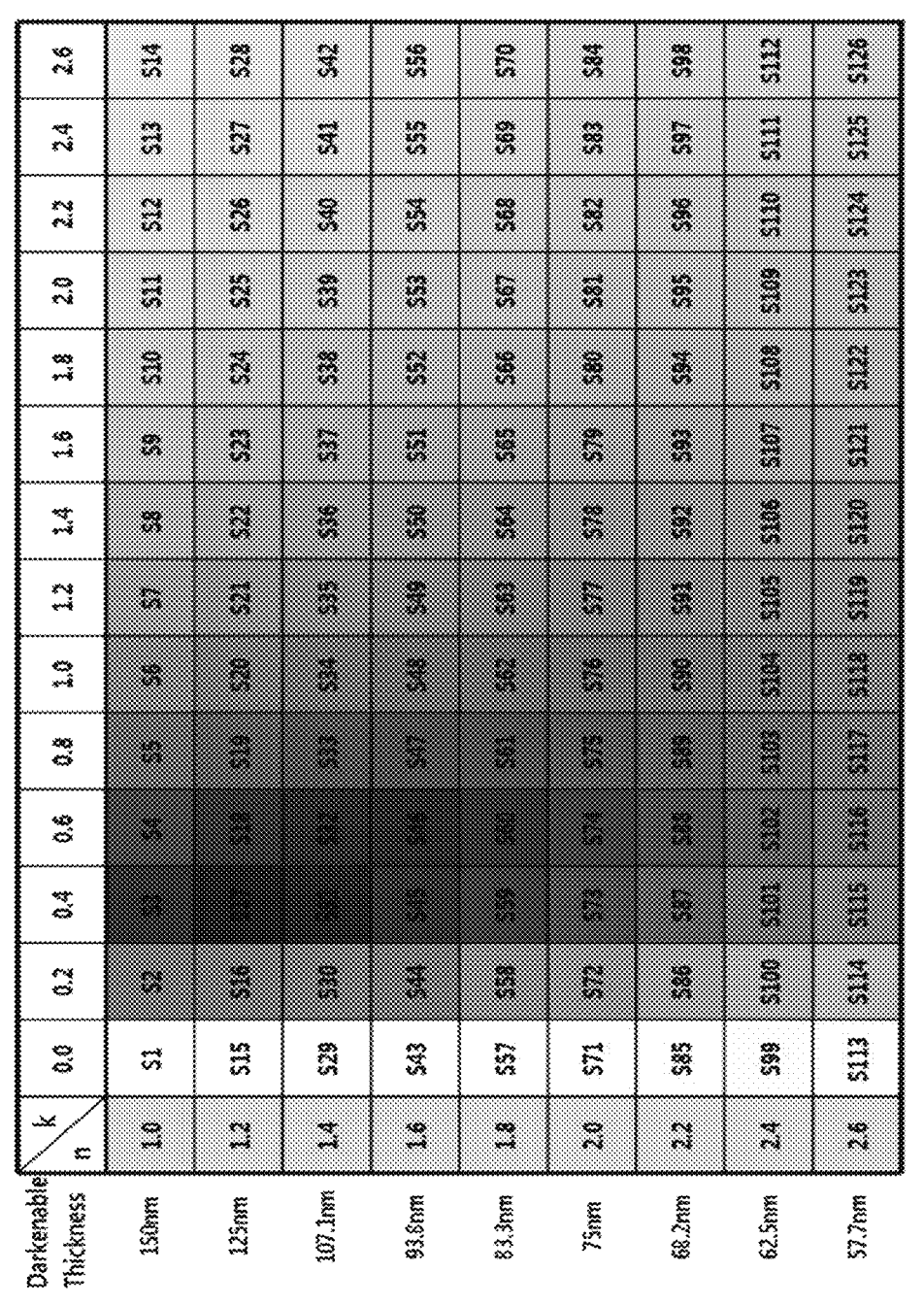

Further, the color according to the n and k values under the extinction interference condition at a wavelength of 600 nm was illustrated in FIG. 9. This is obtained by converting the percentage value of the parameter for reducing visuality of the conductive structure body calculated by the value of Equation 1 when the Al lower electrode has the structure having reflectance of 90% into a color difference.

Further, Table 2 illustrates the simulation result obtained by using the Macleod program under the extinction interference condition at the wavelengths of 550 nm, 600 nm, and 650 nm when the lower electrode has the structure having reflectance of about 90%.

Table 2 illustrates the percentage values of the parameter for reducing visuality of the conductive structure body at the wavelength of 550 nm, 600 nm, and 650 nm, and the average percentage values of the parameter for reducing visuality of the conductive structure body in the wavelength region of 380 nm to 780 nm, which are obtained by simulation using the Macleod program, and in this case, the parameter A* representing brightness to the wavelength of 600 nm. In Table 2, S1 to S126 correspond to those of Table 1, and in this case, the n and k values correspond to those of Table 1.

TABLE 2

| # | R(%) @550 nm | R(%) @ 600 nm | R(%) @650 nm | 380 to 780 nm Avg. R(%) | A* |
|---|---|---|---|---|---|
| S1 | 91.6 | 91.2 | 90.7 | 90.8 | 96.5 |
| S2 | 15.0 | 20.1 | 25.5 | 19.1 | 51.9 |
| S3 | 2.4 | 5.3 | 9.0 | 6.3 | 27.6 |
| S4 | 4.7 | 6.0 | 8.1 | 7.4 | 29.4 |
| S5 | 11.0 | 11.5 | 12.6 | 12.7 | 40.4 |
| S6 | 18.3 | 18.4 | 18.9 | 19.2 | 50.0 |
| S7 | 25.5 | 25.5 | 25.7 | 26 | 57.5 |
| S8 | 32.4 | 32.3 | 32.4 | 32.6 | 63.6 |
| S9 | 38.8 | 38.7 | 38.8 | 38.9 | 68.6 |
| S10 | 44.6 | 44.6 | 44.6 | 44.7 | 72.6 |
| S11 | 49.9 | 49.9 | 49.9 | 50 | 76.0 |
| S12 | 54.7 | 54.7 | 54.7 | 54.7 | 78.9 |
| S13 | 59.0 | 59.0 | 59.0 | 59 | 81.3 |
| S14 | 62.8 | 62.8 | 62.8 | 62.8 | 83.3 |
| S15 | 88.8 | 87.8 | 87.0 | 87.9 | 95.1 |
| S16 | 14.4 | 18.1 | 22.8 | 19.4 | 49.6 |
| S17 | 0.8 | 3.0 | 6.4 | 5.2 | 20.1 |
| S18 | 2.3 | 3.2 | 5.2 | 5.3 | 20.9 |
| S19 | 8.0 | 8.2 | 9.3 | 10 | 34.5 |
| S20 | 14.8 | 14.8 | 15.3 | 16 | 45.3 |
| S21 | 21.7 | 21.5 | 21.8 | 22.4 | 53.5 |
| S22 | 28.3 | 28.2 | 28.3 | 28.7 | 60.0 |
| S23 | 34.5 | 34.4 | 34.4 | 34.7 | 65.3 |
| S24 | 40.2 | 40.2 | 40.2 | 40.4 | 69.6 |
| S25 | 45.5 | 45.5 | 45.5 | 45.6 | 73.2 |
| S26 | 50.3 | 50.3 | 50.3 | 50.4 | 76.2 |
| S27 | 54.7 | 54.6 | 54.6 | 54.7 | 78.8 |
| S28 | 58.6 | 58.6 | 58.6 | 58.6 | 81.1 |
| S29 | 86.1 | 84.3 | 82.9 | 85 | 93.6 |
| S30 | 15.1 | 16.8 | 20.4 | 20.5 | 48.0 |
| S31 | 0.7 | 1.7 | 4.5 | 5.3 | 13.9 |
| S32 | 1.3 | 1.5 | 3.2 | 4.6 | 12.9 |
| S33 | 6.3 | 6.2 | 7.1 | 8.5 | 29.9 |
| S34 | 12.6 | 12.4 | 12.8 | 14.1 | 41.8 |
| S35 | 19.2 | 18.9 | 19.1 | 20.1 | 50.5 |
| S36 | 25.5 | 25.2 | 25.3 | 26.1 | 57.3 |
| S37 | 31.5 | 31.3 | 31.3 | 31.8 | 62.7 |
| S38 | 37.0 | 36.9 | 36.9 | 37.2 | 67.2 |
| S39 | 42.2 | 42.1 | 42.1 | 42.3 | 70.9 |
| S40 | 46.9 | 46.8 | 46.8 | 47 | 74.1 |
| S41 | 51.2 | 51.2 | 51.2 | 51.3 | 76.8 |
| S42 | 55.2 | 55.2 | 55.1 | 55.2 | 79.1 |
| S43 | 84.0 | 81.0 | 78.6 | 82.3 | 92.1 |
| S44 | 17.0 | 16.2 | 18.2 | 22.1 | 47.3 |
| S45 | 1.9 | 1.2 | 2.9 | 6.4 | 10.9 |
| S46 | 1.4 | 0.7 | 1.8 | 4.7 | 6.7 |
| S47 | 5.8 | 5.0 | 5.6 | 8.1 | 26.8 |
| S48 | 11.6 | 10.9 | 11.1 | 13.1 | 39.4 |
| S49 | 17.7 | 17.1 | 17.2 | 18.7 | 48.4 |
| S50 | 23.7 | 23.2 | 23.2 | 24.4 | 55.3 |
| S51 | 29.4 | 29.0 | 29.0 | 29.8 | 60.8 |
| S52 | 34.8 | 34.5 | 34.4 | 35 | 65.3 |
| S53 | 39.7 | 39.5 | 39.5 | 39.9 | 69.1 |
| S54 | 44.3 | 44.2 | 44.1 | 44.4 | 72.4 |
| S55 | 48.6 | 48.5 | 48.4 | 48.6 | 75.1 |
| S56 | 52.5 | 52.4 | 52.4 | 52.5 | 77.5 |
| S57 | 82.4 | 78.0 | 74.4 | 79.7 | 90.8 |
| S58 | 19.9 | 16.6 | 16.6 | 24 | 47.7 |
| S59 | 4.0 | 1.6 | 2.0 | 8.1 | 13.2 |
| S60 | 2.6 | 0.7 | 0.9 | 5.7 | 6.2 |
| S61 | 6.1 | 4.6 | 4.6 | 8.3 | 25.5 |
| S62 | 11.3 | 10.1 | 10.0 | 12.9 | 38.0 |
| S63 | 17.0 | 16.0 | 15.8 | 18.1 | 47.0 |
| S64 | 22.7 | 21.9 | 21.7 | 23.3 | 53.9 |
| S65 | 28.1 | 27.5 | 27.3 | 28.5 | 59.4 |
| S66 | 33.2 | 32.7 | 32.6 | 33.5 | 63.9 |
| S67 | 38.0 | 37.6 | 37.5 | 38.1 | 67.7 |
| S68 | 42.4 | 42.2 | 42.1 | 42.5 | 71.0 |
| S69 | 46.5 | 46.4 | 46.3 | 46.6 | 73.8 |
| S70 | 50.3 | 50.2 | 50.2 | 50.4 | 76.2 |
| S71 | 81.5 | 75.7 | 70.5 | 77.4 | 89.7 |
| S72 | 23.7 | 17.8 | 15.6 | 26.2 | 49.3 |
| S73 | 7.1 | 2.8 | 1.5 | 10.3 | 19.0 |
| S74 | 4.6 | 1.3 | 0.4 | 7.2 | 11.5 |
| S75 | 7.2 | 4.8 | 4.0 | 9.2 | 26.0 |
| S76 | 11.8 | 9.9 | 9.3 | 13.2 | 37.6 |
| S77 | 17.0 | 15.5 | 15.0 | 18 | 46.3 |
| S78 | 22.2 | 21.1 | 20.6 | 22.9 | 53.0 |
| S79 | 27.3 | 26.4 | 26.1 | 27.8 | 58.5 |
| S80 | 32.2 | 31.5 | 31.2 | 32.5 | 62.9 |
| S81 | 36.8 | 36.2 | 36.0 | 36.9 | 66.7 |
| S82 | 41.0 | 40.6 | 40.4 | 41.1 | 69.9 |
| S83 | 45.0 | 44.7 | 44.6 | 45.1 | 72.7 |
| S84 | 48.7 | 48.5 | 48.4 | 48.7 | 75.1 |
| S85 | 81.1 | 74.0 | 67.1 | 75.4 | 88.9 |
| S86 | 28.2 | 19.9 | 15.2 | 28.6 | 51.8 |

TABLE 2-continued

| # | R(%) @550 nm | R(%) @ 600 nm | R(%) @650 nm | 380 to 780 nm Avg. R(%) | A* |
|---|---|---|---|---|---|
| S87 | 11.0 | 4.7 | 1.6 | 12.9 | 25.8 |
| S88 | 7.3 | 2.6 | 0.5 | 9.2 | 18.6 |
| S89 | 9.0 | 5.5 | 3.9 | 10.5 | 28.1 |
| S90 | 12.8 | 10.2 | 9.0 | 14 | 38.2 |
| S91 | 17.5 | 15.4 | 14.5 | 18.3 | 46.2 |
| S92 | 22.3 | 20.7 | 20.0 | 22.9 | 52.7 |
| S93 | 27.1 | 25.9 | 25.2 | 27.4 | 57.9 |
| S94 | 31.6 | 30.7 | 30.2 | 31.9 | 62.3 |
| S95 | 36.0 | 35.3 | 34.9 | 36.1 | 66.0 |
| S96 | 40.1 | 39.5 | 39.2 | 40.1 | 69.1 |
| S97 | 43.9 | 43.5 | 43.2 | 43.9 | 71.9 |
| S98 | 47.5 | 47.1 | 47.0 | 47.5 | 74.3 |
| S99 | 81.2 | 73.1 | 64.4 | 73.8 | 88.5 |
| S100 | 33.0 | 22.8 | 15.6 | 31.1 | 54.9 |
| S101 | 15.4 | 7.3 | 2.3 | 15.7 | 32.5 |
| S102 | 10.6 | 4.5 | 1.0 | 11.5 | 25.4 |
| S103 | 11.3 | 6.8 | 4.2 | 12.3 | 31.2 |
| S104 | 14.3 | 10.9 | 9.0 | 15.2 | 39.4 |
| S105 | 18.4 | 15.8 | 14.3 | 19 | 46.7 |
| S106 | 22.8 | 20.8 | 19.6 | 23.2 | 52.7 |
| S107 | 27.2 | 25.6 | 24.7 | 27.5 | 57.7 |
| S108 | 31.5 | 30.3 | 29.5 | 31.7 | 61.9 |
| S109 | 35.6 | 34.6 | 34.1 | 35.7 | 65.5 |
| S110 | 39.5 | 38.7 | 38.3 | 39.5 | 68.6 |
| S111 | 43.1 | 42.6 | 42.2 | 43.1 | 71.3 |
| S112 | 46.6 | 46.1 | 45.8 | 46.5 | 73.6 |
| S113 | 81.7 | 72.9 | 62.5 | 72.5 | 88.4 |
| S114 | 38.0 | 26.3 | 16.8 | 33.8 | 58.3 |
| S115 | 20.2 | 10.6 | 3.7 | 18.8 | 38.9 |
| S116 | 14.4 | 7.0 | 2.1 | 14.2 | 31.8 |
| S117 | 14.1 | 8.5 | 4.9 | 14.3 | 35.0 |
| S118 | 16.3 | 12.1 | 9.4 | 16.7 | 41.4 |
| S119 | 19.8 | 16.5 | 14.5 | 20.1 | 47.6 |
| S120 | 23.7 | 21.1 | 19.5 | 23.9 | 53.1 |
| S121 | 27.7 | 25.7 | 24.5 | 27.8 | 57.8 |
| S122 | 31.7 | 30.1 | 29.1 | 31.7 | 61.8 |
| S123 | 35.5 | 34.3 | 33.5 | 35.5 | 65.2 |
| S124 | 39.2 | 38.2 | 37.6 | 39.2 | 68.2 |
| S125 | 42.7 | 41.9 | 41.4 | 42.6 | 70.8 |
| S126 | 45.9 | 45.4 | 45.0 | 45.9 | 73.1 |

Reviewing the simulation result using the Macleod program of Table 2, it can be confirmed that if the percentage of the parameter for reducing visuality of the conductive structure body to light having at least one wavelength of light having the wavelength of 550 nm to 650 nm is 20% or less, the average percentage of the parameter for reducing visuality of the conductive structure body in the wavelength region of 380 nm to 780 nm is 20% or less. Further, it can be confirmed that if the percentage of the parameter for reducing visuality of the conductive structure body to light having the wavelength of 600 nm is 20% or less, the average percentage of the parameter for reducing visuality of the conductive structure body in the wavelength region of 380 nm to 780 nm is 20% or less.

Further, it can be confirmed that if the parameter A* representing brightness to the wavelength of 600 nm is 51.8 or less, the average percentage of the parameter for reducing visuality of the conductive structure body in the wavelength region of 380 nm to 780 nm is 20% or less, and if A* is 40 or less, the average percentage of the parameter for reducing visuality of the conductive structure body in the wavelength region of 380 nm to 780 nm is further reduced to about 15% or less.

Further, if the case where the percentage of the parameter for reducing visuality of the conductive structure body is 20% or less or the value of the parameter A* representing brightness to the wavelength of 600 nm is 51.8 or less, or the case where the average percentage of the parameter for reducing visuality of the conductive structure body in the wavelength region of 380 nm to 780 nm is 20% is applied to Table 1, it can be confirmed that the range of the k value is 0.2 to 1.2. Further, if the value of the parameter A* representing brightness to the wavelength of 600 nm is about 40 or less, the percentage of the parameter for reducing visuality of the conductive structure body is about 12% or less, or the average percentage of the parameter for reducing visuality of the conductive structure body in the wavelength region of 380 nm to 780 nm is about 15% or less, it can be confirmed that the range of the k value is 0.4 to 1.0.

Figure 10:
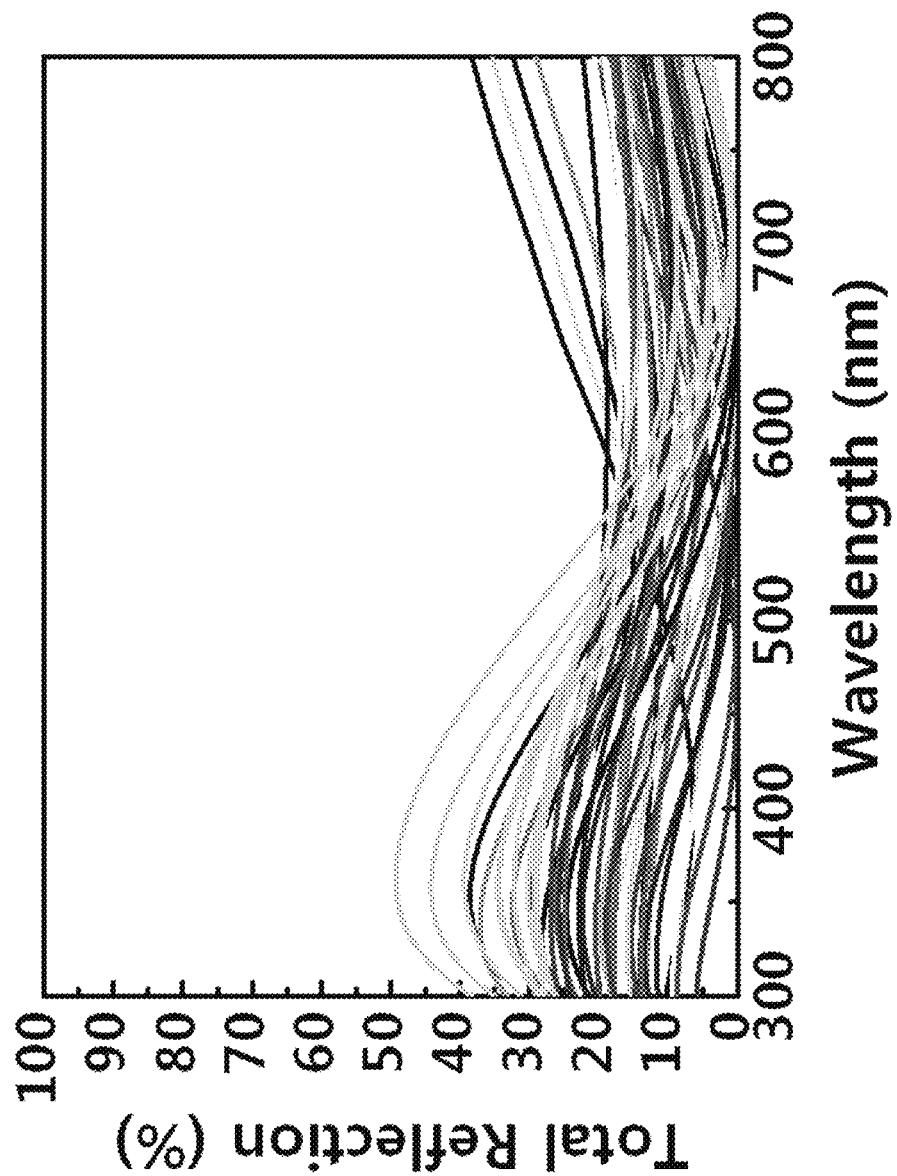
FIG. 10 is a graph illustrating all cases where an average percentage of a parameter for reducing visuality of the conductive structure body in the wavelength region of 300 nm to 800 nm is 20% or less in Table 2 as the exemplary embodiment of the present application.

FIG. 10 is a graph illustrating all cases where the average percentage of the parameter for reducing visuality of the conductive structure body in the wavelength region of 300 nm to 800 nm is 20% or less in Table 2.

Figure 11:
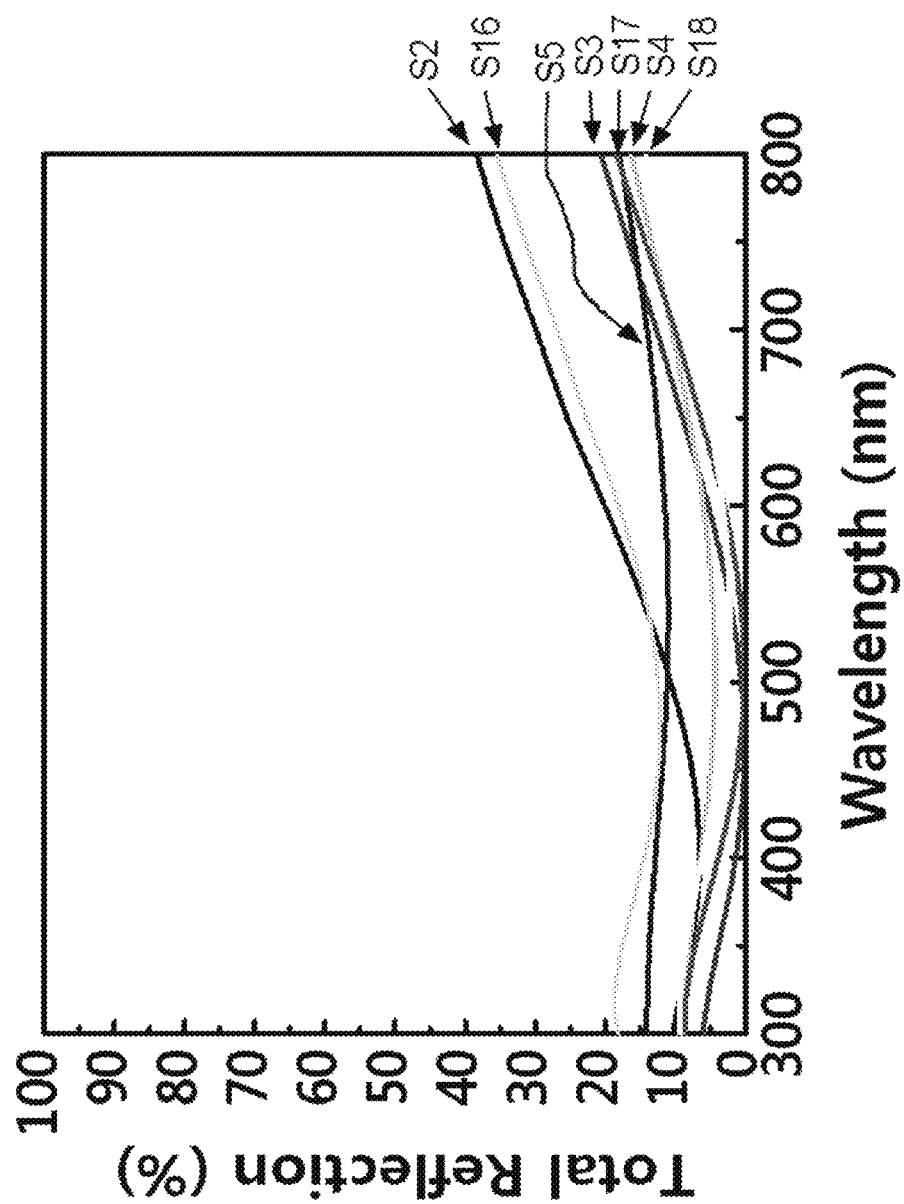
FIG. 11 illustrates a graph of S2, S3, S4, S5, S16, S17, and S18 of FIG. 10.
Figure 12:
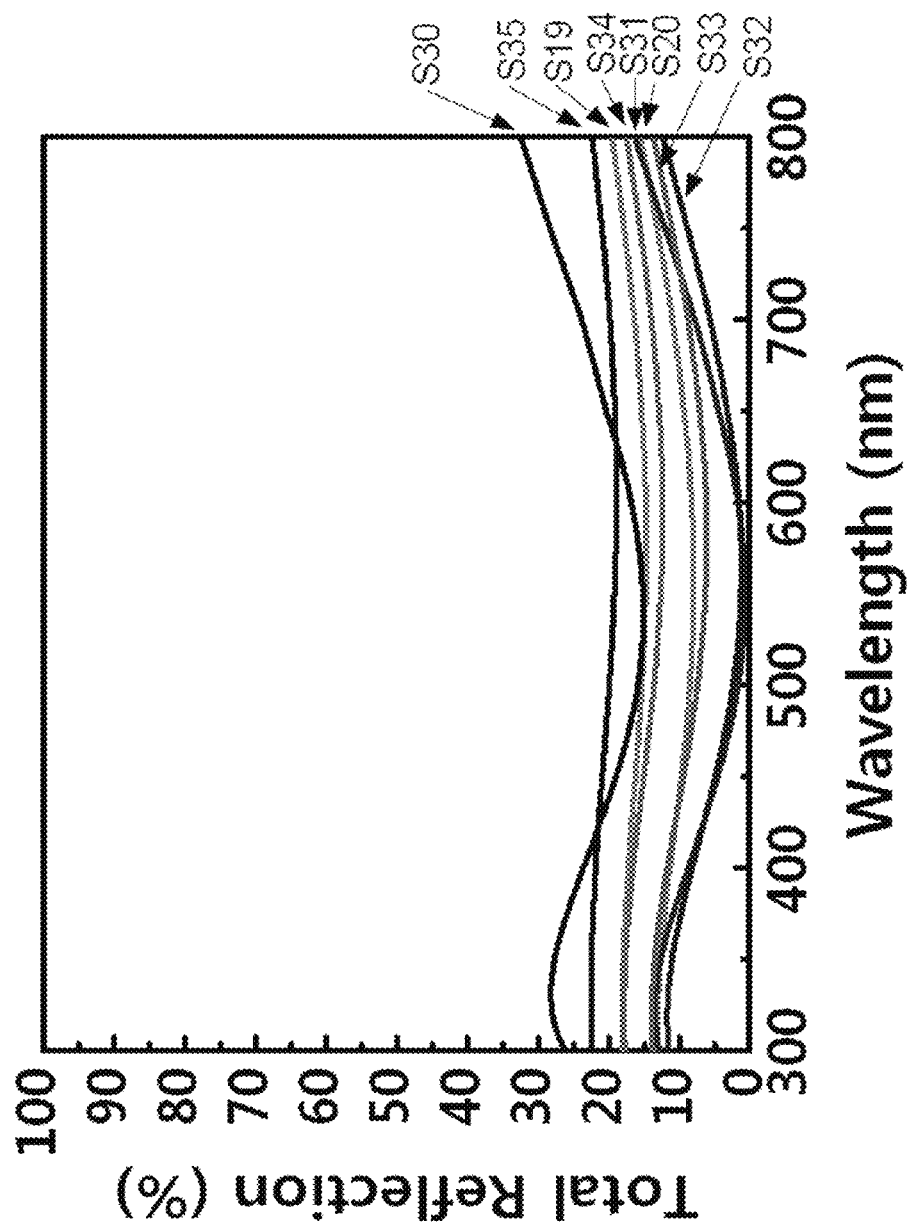
FIG. 12 illustrates a graph of S19, S20, S30, S31, S32, S33, S34, and S35 of FIG. 10.
Figure 13:
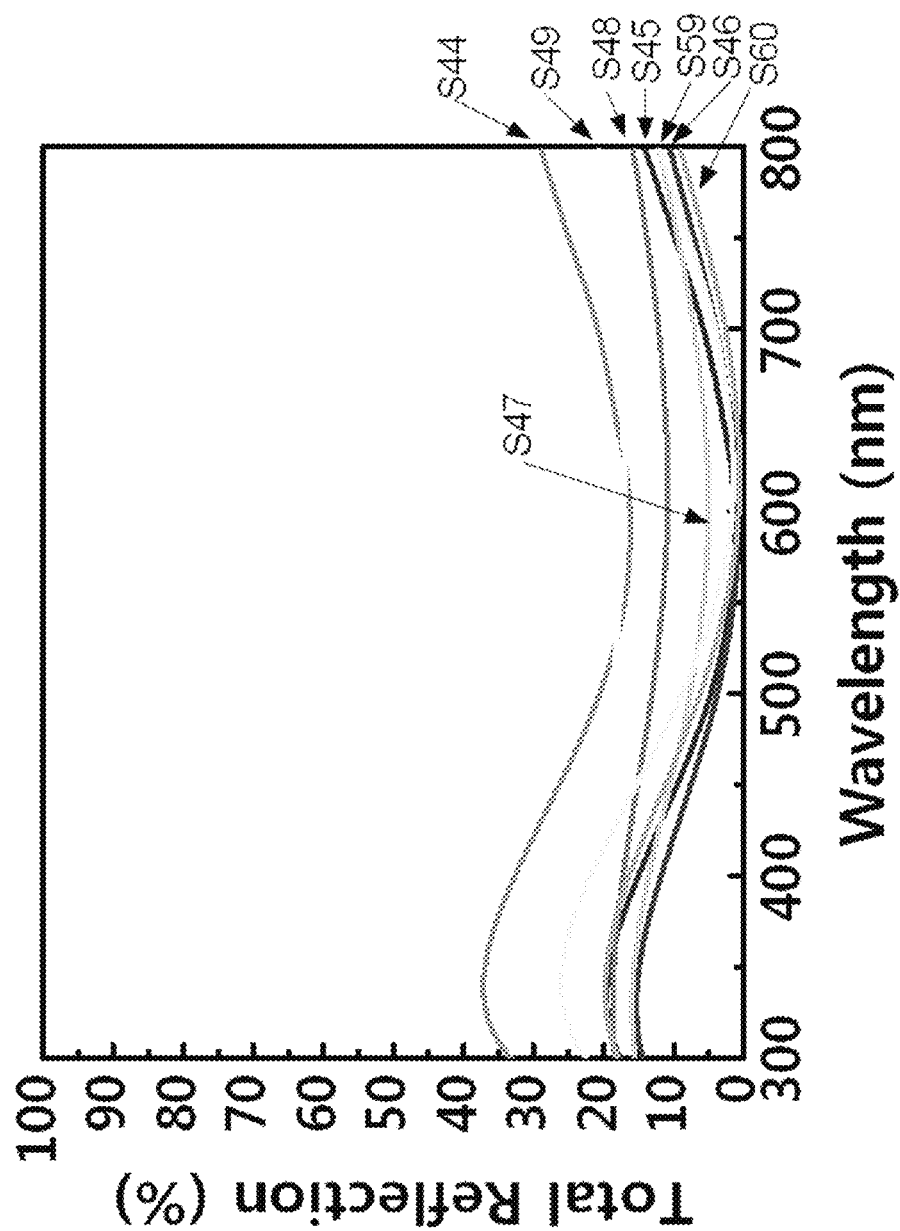
FIG. 13 illustrates a graph of S44, S45, S46, S47, S48, S49, S59, and S60 of FIG. 10.
Figure 14:
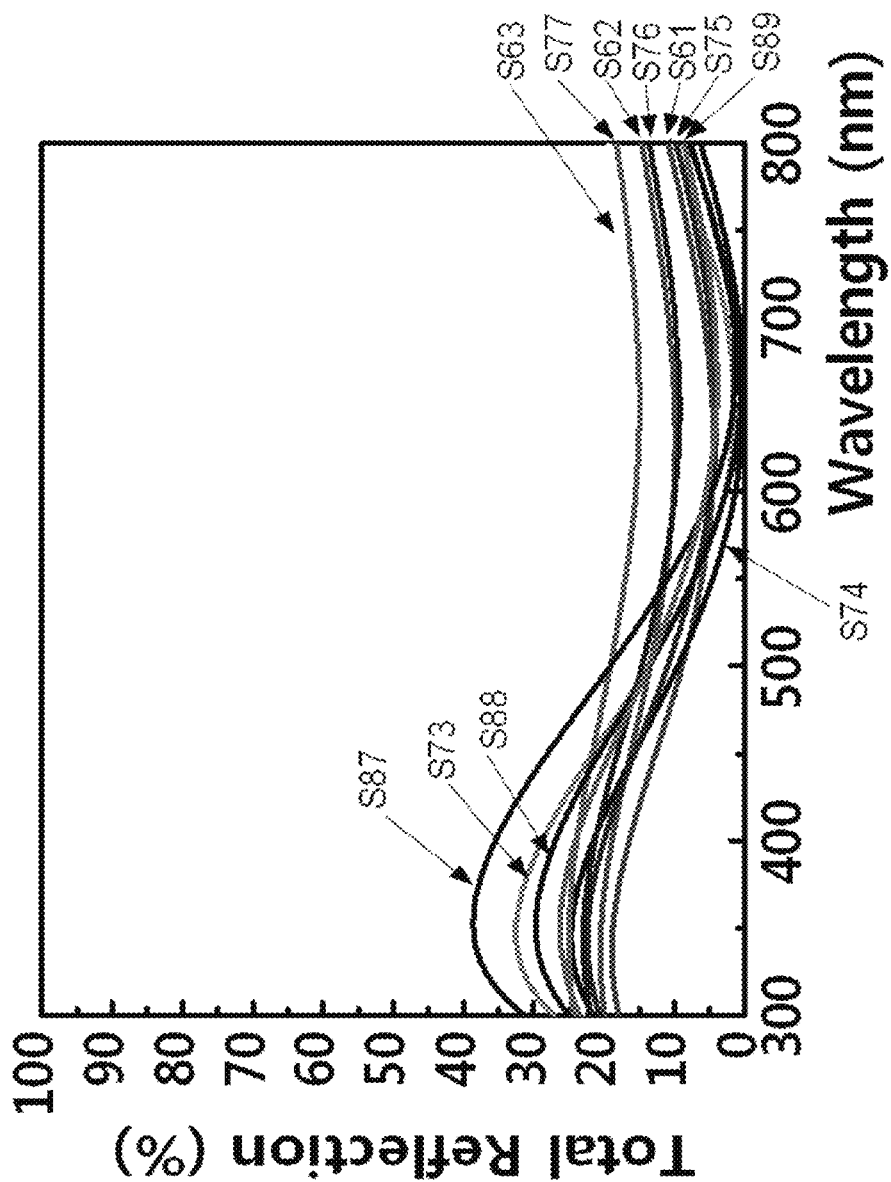
FIG. 14 illustrates a graph of S61, S62, S63, S73, S74, S75, S76, S77, S87, S88, and S89 of FIG. 10.
Figure 15:
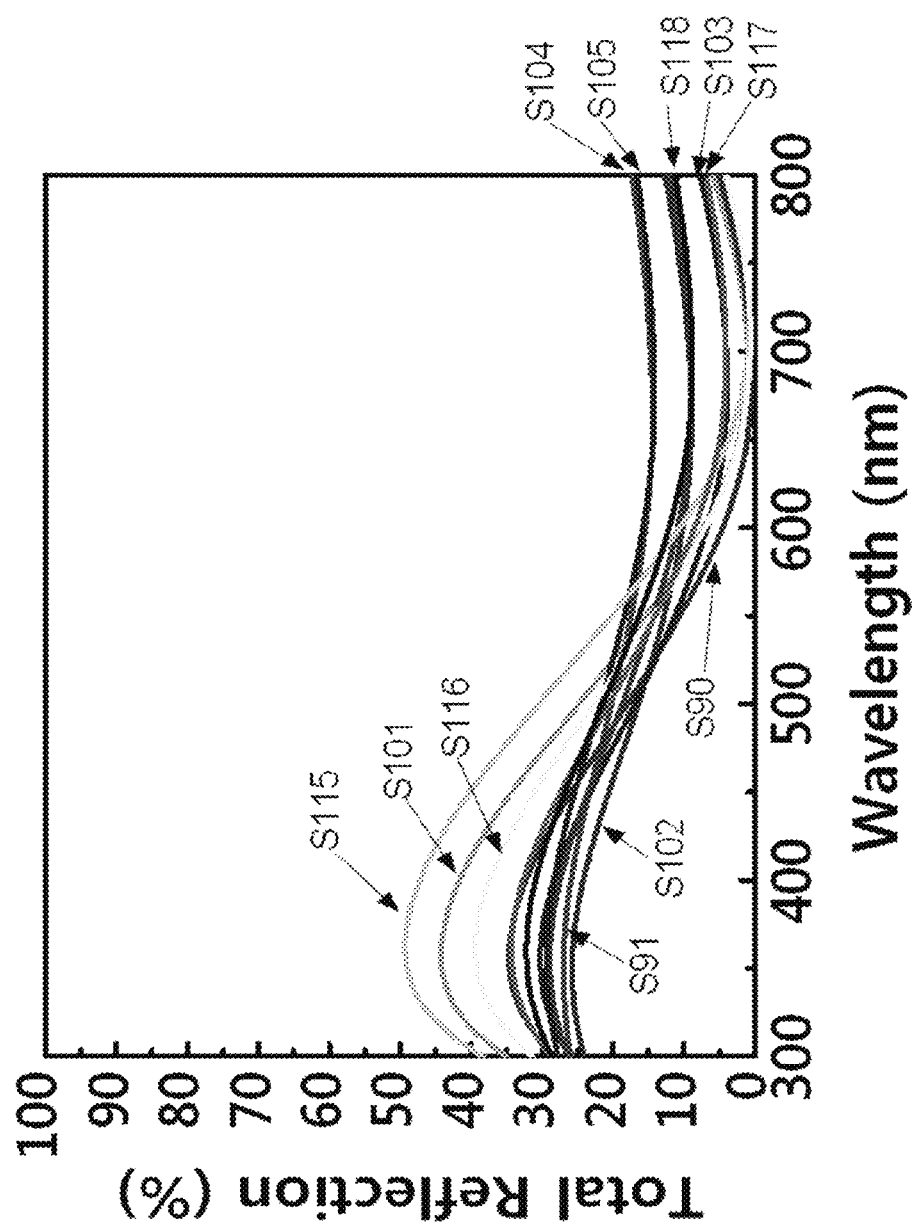
FIG. 15 illustrates a graph of S90, S91, S101, S102, S103, S104, S105, S115, S116, S117, and S118 of FIG. 10.

Further, FIG. 11 illustrates a graph of S2, S3, S4, S5, S16, S17, and S18, FIG. 12 illustrates a graph of S19, S20, S30, S31, S32, S33, S34, and S35, and FIG. 13 illustrates a graph of S44, S45, S46, S47, S48, S49, S59, and S60 in FIG. 10. Further, FIG. 14 illustrates a graph of S61, S62, S63, S73, S74, S75, S76, S77, S87, S88, and S89, and FIG. 15 illustrates a graph of S90, S91, S101, S102, S103, S104, S105, S115, S116, S117, and S118.

Meanwhile, the calculated parameter value under the extinction interference condition at a wavelength of 600 nm when the Al lower electrode has the structure having reflectance of 90% is described in the following Table 3. Table 3 illustrated the percentage value of the parameter for reducing visuality of the conductive structure body calculated by the value of Equation 1 according to the n and k values at the wavelength of 600 nm, the thickness of the darkening layer calculated by the value of Equation 2, and the parameter A* representing brightness to the wavelength of 600 nm calculated by Equation 3.

TABLE 3

| # | Extinction interference wavelength (nm) | Reflectance of the electrode layer (%) @ extinction interference wavelength | At extinction interference wavelength | | Thickness of the darkening layer (nm) | Total R(%) absolute value | A* |
|---|---|---|---|---|---|---|---|
| | | | n | k | | | |
| 1 | 600 | 90 | 1 | 0 | 150.00 | 90.00 | 96.00 |
| 2 | 600 | 90 | 1 | 0.2 | 150.00 | 24.37 | 56.46 |
| 3 | 600 | 90 | 1 | 0.4 | 150.00 | 3.16 | 20.67 |
| 4 | 600 | 90 | 1 | 0.6 | 150.00 | 6.35 | 30.28 |
| 5 | 600 | 90 | 1 | 0.8 | 150.00 | 13.28 | 43.18 |
| 6 | 600 | 90 | 1 | 1 | 150.00 | 19.87 | 51.69 |
| 7 | 600 | 90 | 1 | 1.2 | 150.00 | 26.44 | 58.45 |
| 8 | 600 | 90 | 1 | 1.4 | 150.00 | 32.88 | 64.20 |

TABLE 3-continued

| # | Extinction interference wavelength (nm) | Reflectance of the electrode layer (%) @ extinction interference wavelength | At extinction interference wavelength n | k | Thickness of the darkening layer (nm) | Total R(%) absolute value | A* |
|---|---|---|---|---|---|---|---|
| 9 | 600 | 90 | 1 | 1.6 | 150.00 | 39.02 | 68.77 |
| 10 | 600 | 90 | 1 | 1.8 | 150.00 | 44.75 | 72.73 |
| 11 | 600 | 90 | 1 | 2 | 150.00 | 50.00 | 76.07 |
| 12 | 600 | 90 | 1 | 2.2 | 150.00 | 54.75 | 78.90 |
| 13 | 600 | 90 | 1 | 2.4 | 150.00 | 59.02 | 81.30 |
| 14 | 600 | 90 | 1 | 2.6 | 150.00 | 62.83 | 83.35 |
| ⋮ | | | | | | | |
| 113 | 600 | 90 | 2.6 | 0 | 57.69 | 52.47 | 77.56 |
| 114 | 600 | 90 | 2.6 | 0.2 | 57.69 | 24.40 | 56.49 |
| 115 | 600 | 90 | 2.6 | 0.4 | 57.69 | 6.40 | 30.40 |
| 116 | 600 | 90 | 2.6 | 0.6 | 57.69 | 5.44 | 27.95 |
| 117 | 600 | 90 | 2.6 | 0.8 | 57.69 | 13.57 | 43.61 |
| 118 | 600 | 90 | 2.6 | 1 | 57.69 | 19.52 | 51.29 |
| 119 | 600 | 90 | 2.6 | 1.2 | 57.69 | 24.20 | 56.29 |
| 120 | 600 | 90 | 2.6 | 1.4 | 57.69 | 28.17 | 60.04 |
| 121 | 600 | 90 | 2.6 | 1.6 | 57.69 | 31.73 | 63.12 |
| 122 | 600 | 90 | 2.6 | 1.8 | 57.69 | 35.06 | 65.80 |
| 123 | 600 | 90 | 2.6 | 2 | 57.69 | 38.24 | 68.20 |
| 124 | 600 | 90 | 2.6 | 2.2 | 57.69 | 41.31 | 70.39 |
| 125 | 600 | 90 | 2.6 | 2.4 | 57.69 | 44.29 | 72.42 |
| 126 | 600 | 90 | 2.6 | 2.6 | 57.69 | 47.17 | 74.30 |

Reviewing Table 3, it can be confirmed that if the percentage of the parameter for reducing visuality of the conductive structure body to light having the wavelength of 600 nm is 20% or less, or the parameter A* representing brightness to the wavelength of 600 nm is 51.8 or less, the range of the k value is 0.4 to 1.

Figure 16:
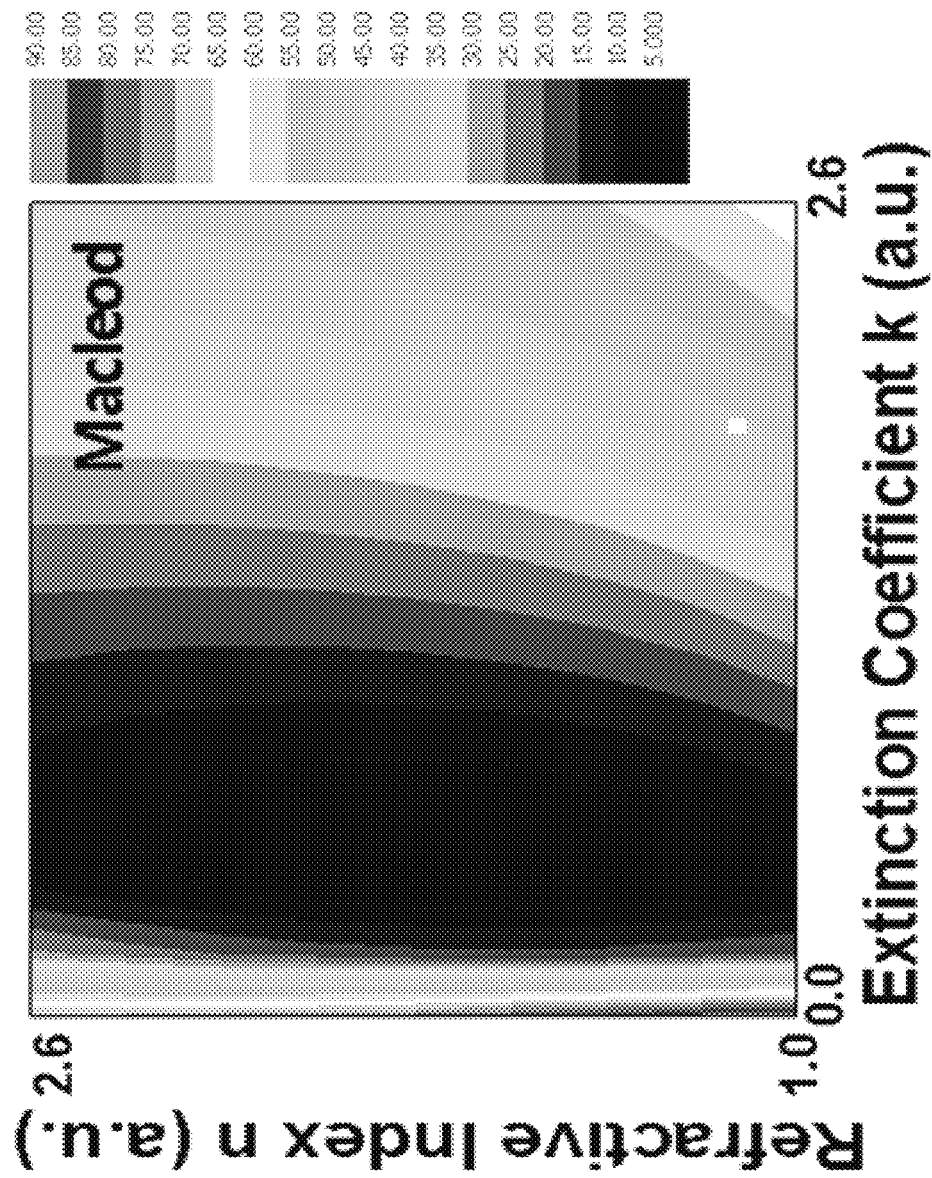
FIG. 16 illustrates the darkenable region when the Al lower electrode is used and simulation is performed by using the Macleod program under an extinction interference condition at a wavelength of 600 nm as the exemplary embodiment of the present application.
Figure 17:
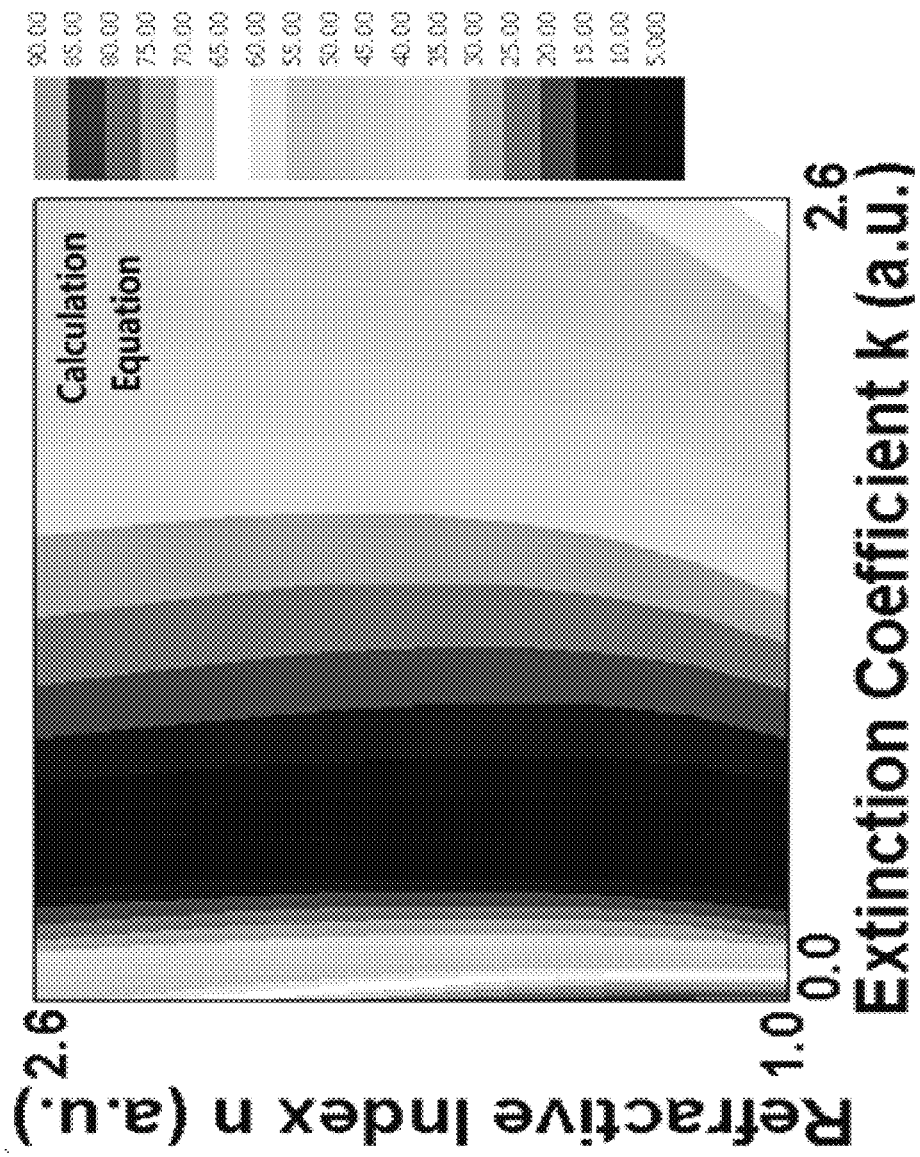
FIG. 17 illustrates the darkenable region when the Al lower electrode is used and a parameter value of Equation 1 according to n and k values is calculated under the extinction interference condition at the wavelength of 600 nm as the exemplary embodiment of the present application.

FIG. 16 illustrates the blackening (darkenable) region when simulation is performed by using the Macleod program based on 600 nm in Table 2, and FIG. 17 illustrates the blackening (darkenable) region that is the calculated value according to Equation 1 based on 600 nm in Table 3.

Comparing FIGS. 16 and 17 to each other, it could be confirmed that the result of the value by the Macleod program and the value by Equation 1 were similar to each other in terms of tendency and the range.

Figure 18:
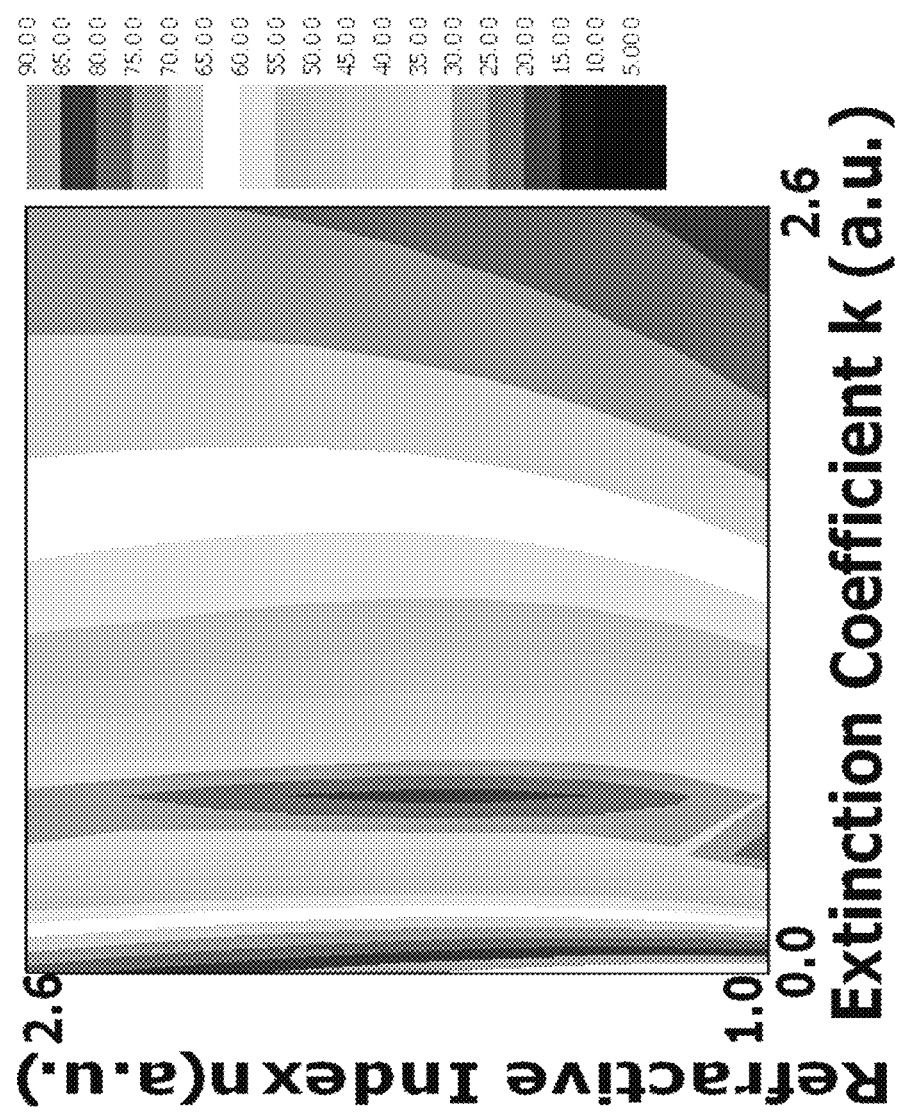
FIG. 18 illustrates the darkenable region when the Al lower electrode is used and a A* value according to n and k values is calculated under the extinction interference condition at the wavelength of 600 nm as the exemplary embodiment of the present application.

Further, FIG. 18 illustrated the blackening (darkenable) region when the A* value according to n and k values was calculated under the extinction interference condition at the wavelength of 600 nm according to Equation 3. Comparing FIG. 18 to FIGS. 16 and 17, it could be confirmed that the color region according to the A* value, the result of the value by the Macleod program, and the result of the value by Equation 1 were similar to each other in terms of tendency and the range.

Example 2

Variables were constituted in a matrix form like Table 1 in Example 1, and verification was performed by using the Mo lower electrode. In this case, a material for forming the darkened layer may be a material having a range of n and k values in the following Table 4, and may be a Mo oxide, a Mo nitride, and $AlO_xN_y$ (x>0, y>0).

The parameter value under the extinction interference condition at a wavelength of 600 nm when the Mo lower electrode has the structure having reflectance of 57.5% is described in the following Table 4. Table 4 illustrated the percentage value of the parameter for reducing visuality of the conductive structure body calculated by the value of Equation 1 according to the n and k values at the wavelength of 600 nm, the thickness of the darkening layer calculated by the value of Equation 2, and the parameter A* representing brightness to the wavelength of 600 nm calculated by Equation 3.

TABLE 4

| # | Extinction interference wavelength (nm) | Reflectance of the electrode layer (%) @ extinction interference wavelength | At extinction interference wavelength n | k | Thickness of the darkening layer (nm) | Total R(%) absolute value | A* |
|---|---|---|---|---|---|---|---|
| 1 | 600 | 57.5 | 1 | 0 | 150.00 | 57.50 | 80.46 |
| 2 | 600 | 57.5 | 1 | 0.2 | 150.00 | 15.21 | 45.92 |
| 3 | 600 | 57.5 | 1 | 0.4 | 150.00 | 0.63 | 5.71 |
| 4 | 600 | 57.5 | 1 | 0.6 | 150.00 | 7.04 | 31.90 |
| 5 | 600 | 57.5 | 1 | 0.8 | 150.00 | 13.47 | 43.46 |
| 6 | 600 | 57.5 | 1 | 1 | 150.00 | 19.91 | 51.74 |
| 7 | 600 | 57.5 | 1 | 1.2 | 150.00 | 26.45 | 58.46 |

TABLE 4-continued

| # | Extinction interference wavelength (nm) | Reflectance of the electrode layer (%) @ extinction interference wavelength | At extinction interference wavelength n | k | Thickness of the darkening layer (nm) | Total R(%) absolute value | A* |
|---|---|---|---|---|---|---|---|
| 8 | 600 | 57.5 | 1 | 1.4 | 150.00 | 32.88 | 64.06 |
| 9 | 600 | 57.5 | 1 | 1.6 | 150.00 | 39.02 | 68.77 |
| 10 | 600 | 57.5 | 1 | 1.8 | 150.00 | 44.75 | 72.73 |
| 11 | 600 | 57.5 | 1 | 2 | 150.00 | 50.00 | 76.07 |
| 12 | 600 | 57.5 | 1 | 2.2 | 150.00 | 54.75 | 78.90 |
| 13 | 600 | 57.5 | 1 | 2.4 | 150.00 | 59.02 | 81.30 |
| 14 | 600 | 57.5 | 1 | 2.6 | 150.00 | 62.83 | 83.35 |
| 15 | 600 | 57.5 | 1.2 | 0 | 125.00 | 56.20 | 79.73 |
| 16 | 600 | 57.5 | 1.2 | 0.2 | 125.00 | 18.21 | 49.75 |
| 17 | 600 | 57.5 | 1.2 | 0.4 | 125.00 | 2.80 | 19.21 |
| 18 | 600 | 57.5 | 1.2 | 0.6 | 125.00 | 5.40 | 27.84 |
| 19 | 600 | 57.5 | 1.2 | 0.8 | 125.00 | 11.64 | 40.65 |
| 20 | 600 | 57.5 | 1.2 | 1 | 125.00 | 17.56 | 48.95 |
| 21 | 600 | 57.5 | 1.2 | 1.2 | 125.00 | 23.48 | 55.57 |
| 22 | 600 | 57.5 | 1.2 | 1.4 | 125.00 | 29.39 | 61.12 |
| 23 | 600 | 57.5 | 1.2 | 1.6 | 125.00 | 35.13 | 65.85 |
| 24 | 600 | 57.5 | 1.2 | 1.8 | 125.00 | 40.59 | 69.89 |
| 25 | 600 | 57.5 | 1.2 | 2 | 125.00 | 45.70 | 73.35 |
| 26 | 600 | 57.5 | 1.2 | 2.2 | 125.00 | 50.41 | 76.32 |
| 27 | 600 | 57.5 | 1.2 | 2.4 | 125.00 | 54.72 | 78.88 |
| 28 | 600 | 57.5 | 1.2 | 2.6 | 125.00 | 58.62 | 81.08 |
| 29 | 600 | 57.5 | 1.4 | 0 | 107.14 | 53.13 | 77.95 |
| 30 | 600 | 57.5 | 1.4 | 0.2 | 107.14 | 19.18 | 50.89 |
| 31 | 600 | 57.5 | 1.4 | 0.4 | 107.14 | 3.63 | 22.40 |
| 32 | 600 | 57.5 | 1.4 | 0.6 | 107.14 | 4.94 | 26.55 |
| 33 | 600 | 57.5 | 1.4 | 0.8 | 107.14 | 11.11 | 39.77 |
| 34 | 600 | 57.5 | 1.4 | 1 | 107.14 | 16.62 | 47.78 |
| 35 | 600 | 57.5 | 1.4 | 1.2 | 107.14 | 22.02 | 54.05 |
| 36 | 600 | 57.5 | 1.4 | 1.4 | 107.14 | 27.38 | 59.33 |
| 37 | 600 | 57.5 | 1.4 | 1.6 | 107.14 | 32.66 | 63.89 |
| 38 | 600 | 57.5 | 1.4 | 1.8 | 107.14 | 37.77 | 67.85 |
| 39 | 600 | 57.5 | 1.4 | 2 | 107.14 | 42.62 | 71.30 |
| 40 | 600 | 57.5 | 1.4 | 2.2 | 107.14 | 47.17 | 74.30 |
| 41 | 600 | 57.5 | 1.4 | 2.4 | 107.14 | 51.39 | 76.91 |
| 42 | 600 | 57.5 | 1.4 | 2.6 | 107.14 | 55.27 | 79.20 |
| 43 | 600 | 57.5 | 1.6 | 0 | 93.75 | 49.11 | 75.52 |
| 44 | 600 | 57.5 | 1.6 | 0.2 | 93.75 | 18.79 | 50.44 |
| 45 | 600 | 57.5 | 1.6 | 0.4 | 93.75 | 3.54 | 22.09 |
| 46 | 600 | 57.5 | 1.6 | 0.6 | 93.75 | 5.21 | 27.33 |
| 47 | 600 | 57.5 | 1.6 | 0.8 | 93.75 | 11.36 | 40.19 |
| 48 | 600 | 57.5 | 1.6 | 1 | 93.75 | 16.59 | 47.74 |
| 49 | 600 | 57.5 | 1.6 | 1.2 | 93.75 | 21.55 | 53.54 |
| 50 | 600 | 57.5 | 1.6 | 1.4 | 93.75 | 26.43 | 58.45 |
| 51 | 600 | 57.5 | 1.6 | 1.6 | 93.75 | 31.26 | 62.72 |
| 52 | 600 | 57.5 | 1.6 | 1.8 | 93.75 | 35.97 | 66.50 |
| 53 | 600 | 57.5 | 1.6 | 2 | 93.75 | 40.51 | 69.83 |
| 54 | 600 | 57.5 | 1.6 | 2.2 | 93.75 | 44.82 | 72.77 |
| 55 | 600 | 57.5 | 1.6 | 2.4 | 93.75 | 48.88 | 75.38 |
| 56 | 600 | 57.5 | 1.6 | 2.6 | 93.75 | 52.66 | 77.67 |
| 57 | 600 | 57.5 | 1.8 | 0 | 83.33 | 44.64 | 72.66 |
| 58 | 600 | 57.5 | 1.8 | 0.2 | 83.33 | 17.51 | 48.90 |
| 59 | 600 | 57.5 | 1.8 | 0.4 | 83.33 | 2.81 | 19.26 |
| 60 | 600 | 57.5 | 1.8 | 0.6 | 83.33 | 5.98 | 29.36 |
| 61 | 600 | 57.5 | 1.8 | 0.8 | 83.33 | 12.10 | 41.38 |
| 62 | 600 | 57.5 | 1.8 | 1 | 83.33 | 17.12 | 48.42 |
| 63 | 600 | 57.5 | 1.8 | 1.2 | 83.33 | 21.74 | 53.75 |
| 64 | 600 | 57.5 | 1.8 | 1.4 | 83.33 | 26.21 | 58.24 |
| 65 | 600 | 57.5 | 1.8 | 1.6 | 83.33 | 30.62 | 62.19 |
| 66 | 600 | 57.5 | 1.8 | 1.8 | 83.33 | 34.95 | 65.71 |
| 67 | 600 | 57.5 | 1.8 | 2 | 83.33 | 39.16 | 68.86 |
| 68 | 600 | 57.5 | 1.8 | 2.2 | 83.33 | 43.20 | 71.69 |
| 69 | 600 | 57.5 | 1.8 | 2.4 | 83.33 | 47.05 | 74.22 |
| 70 | 600 | 57.5 | 1.8 | 2.6 | 83.33 | 50.68 | 76.49 |
| 71 | 600 | 57.5 | 2 | 0 | 75.00 | 40.00 | 69.47 |
| 72 | 600 | 57.5 | 2 | 0.2 | 75.00 | 15.64 | 46.50 |
| 73 | 600 | 57.5 | 2 | 0.4 | 75.00 | 1.63 | 13.40 |
| 74 | 600 | 57.5 | 2 | 0.6 | 75.00 | 7.07 | 31.96 |
| 75 | 600 | 57.5 | 2 | 0.8 | 75.00 | 13.15 | 42.98 |
| 76 | 600 | 57.5 | 2 | 1 | 75.00 | 18.01 | 49.51 |
| 77 | 600 | 57.5 | 2 | 1.2 | 75.00 | 22.36 | 54.40 |
| 78 | 600 | 57.5 | 2 | 1.4 | 75.00 | 26.49 | 58.50 |
| 79 | 600 | 57.5 | 2 | 1.6 | 75.00 | 30.53 | 62.11 |

TABLE 4-continued

| # | Extinction interference wavelength (nm) | Reflectance of the electrode layer (%) @ extinction interference wavelength | At extinction interference wavelength n | k | Thickness of the darkening layer (nm) | Total R(%) absolute value | A* |
|---|---|---|---|---|---|---|---|
| 80 | 600 | 57.5 | 2 | 1.8 | 75.00 | 34.51 | 65.36 |
| 81 | 600 | 57.5 | 2 | 2 | 75.00 | 38.40 | 68.31 |
| 82 | 600 | 57.5 | 2 | 2.2 | 75.00 | 42.16 | 70.98 |
| 83 | 600 | 57.5 | 2 | 2.4 | 75.00 | 45.78 | 73.40 |
| 84 | 600 | 57.5 | 2 | 2.6 | 75.00 | 49.23 | 75.59 |
| 85 | 600 | 57.5 | 2.2 | 0 | 68.18 | 35.35 | 66.02 |
| 86 | 600 | 57.5 | 2.2 | 0.2 | 68.18 | 13.41 | 43.37 |
| 87 | 600 | 57.5 | 2.2 | 0.4 | 68.18 | 0.14 | 1.25 |
| 88 | 600 | 57.5 | 2.2 | 0.6 | 68.18 | 8.38 | 34.76 |
| 89 | 600 | 57.5 | 2.2 | 0.8 | 68.18 | 14.38 | 44.78 |
| 90 | 600 | 57.5 | 2.2 | 1 | 68.18 | 19.12 | 50.83 |
| 91 | 600 | 57.5 | 2.2 | 1.2 | 68.18 | 23.25 | 55.33 |
| 92 | 600 | 57.5 | 2.2 | 1.4 | 68.18 | 27.11 | 59.07 |
| 93 | 600 | 57.5 | 2.2 | 1.6 | 68.18 | 30.84 | 62.37 |
| 94 | 600 | 57.5 | 2.2 | 1.8 | 68.18 | 34.50 | 65.36 |
| 95 | 600 | 57.5 | 2.2 | 2 | 68.18 | 38.08 | 68.08 |
| 96 | 600 | 57.5 | 2.2 | 2.2 | 68.18 | 41.58 | 70.58 |
| 97 | 600 | 57.5 | 2.2 | 2.4 | 68.18 | 44.97 | 72.87 |
| 98 | 600 | 57.5 | 2.2 | 2.6 | 68.18 | 48.22 | 74.96 |
| 99 | 600 | 57.5 | 2.4 | 0 | 62.50 | 30.80 | 62.33 |
| 100 | 600 | 57.5 | 2.4 | 0.2 | 62.50 | 10.95 | 39.49 |
| 101 | 600 | 57.5 | 2.4 | 0.4 | 62.50 | 1.56 | 12.99 |
| 102 | 600 | 57.5 | 2.4 | 0.6 | 62.50 | 9.84 | 37.55 |
| 103 | 600 | 57.5 | 2.4 | 0.8 | 62.50 | 15.74 | 46.63 |
| 104 | 600 | 57.5 | 2.4 | 1 | 62.50 | 20.36 | 52.24 |
| 105 | 600 | 57.5 | 2.4 | 1.2 | 62.50 | 24.32 | 56.41 |
| 106 | 600 | 57.5 | 2.4 | 1.4 | 62.50 | 27.95 | 59.84 |
| 107 | 600 | 57.5 | 2.4 | 1.6 | 62.50 | 31.42 | 62.86 |
| 108 | 600 | 57.5 | 2.4 | 1.8 | 62.50 | 34.80 | 65.59 |
| 109 | 600 | 57.5 | 2.4 | 2 | 62.50 | 38.11 | 68.10 |
| 110 | 600 | 57.5 | 2.4 | 2.2 | 62.50 | 41.36 | 70.43 |
| 111 | 600 | 57.5 | 2.4 | 2.4 | 62.50 | 44.51 | 72.57 |
| 112 | 600 | 57.5 | 2.4 | 2.6 | 62.50 | 47.56 | 74.55 |
| 113 | 600 | 57.5 | 2.6 | 0 | 57.69 | 26.39 | 58.40 |
| 114 | 600 | 57.5 | 2.6 | 0.2 | 57.69 | 8.37 | 34.74 |
| 115 | 600 | 57.5 | 2.6 | 0.4 | 57.69 | 3.40 | 21.56 |
| 116 | 600 | 57.5 | 2.6 | 0.6 | 57.69 | 11.39 | 40.23 |
| 117 | 600 | 57.5 | 2.6 | 0.8 | 57.69 | 17.17 | 48.47 |
| 118 | 600 | 57.5 | 2.6 | 1 | 57.69 | 21.68 | 53.69 |
| 119 | 600 | 57.5 | 2.6 | 1.2 | 57.69 | 25.49 | 57.55 |
| 120 | 600 | 57.5 | 2.6 | 1.4 | 57.69 | 28.93 | 60.72 |
| 121 | 600 | 57.5 | 2.6 | 1.6 | 57.69 | 32.18 | 63.49 |
| 122 | 600 | 57.5 | 2.6 | 1.8 | 57.69 | 35.33 | 66.00 |
| 123 | 600 | 57.5 | 2.6 | 2 | 57.69 | 38.40 | 68.31 |
| 124 | 600 | 57.5 | 2.6 | 2.2 | 57.69 | 41.41 | 70.46 |
| 125 | 600 | 57.5 | 2.6 | 2.4 | 57.69 | 44.35 | 72.46 |
| 126 | 600 | 57.5 | 2.6 | 2.6 | 57.69 | 47.21 | 74.32 |

Reviewing Table 4, it can be confirmed that if the percentage of the parameter for reducing visuality of the conductive structure body to light having the wavelength of 600 nm is 20% or less, the range of the k value is 0.2 to 1. Further, it can be confirmed that if the parameter A* representing brightness to the wavelength of 600 nm is 51.8 or less, the range of the k value is 0.2 to 1.

The average reflectance of Mo in the visible ray region was 57.5(%), and if the percentage of the parameter for reducing visuality of the conductive structure body was 20% or less, the range of the k value was 0.2 to 1, and thus it could be confirmed that the k region having low reflectance was enlarged as compared to the case where the Al electrode layer was used.

Figure 19:
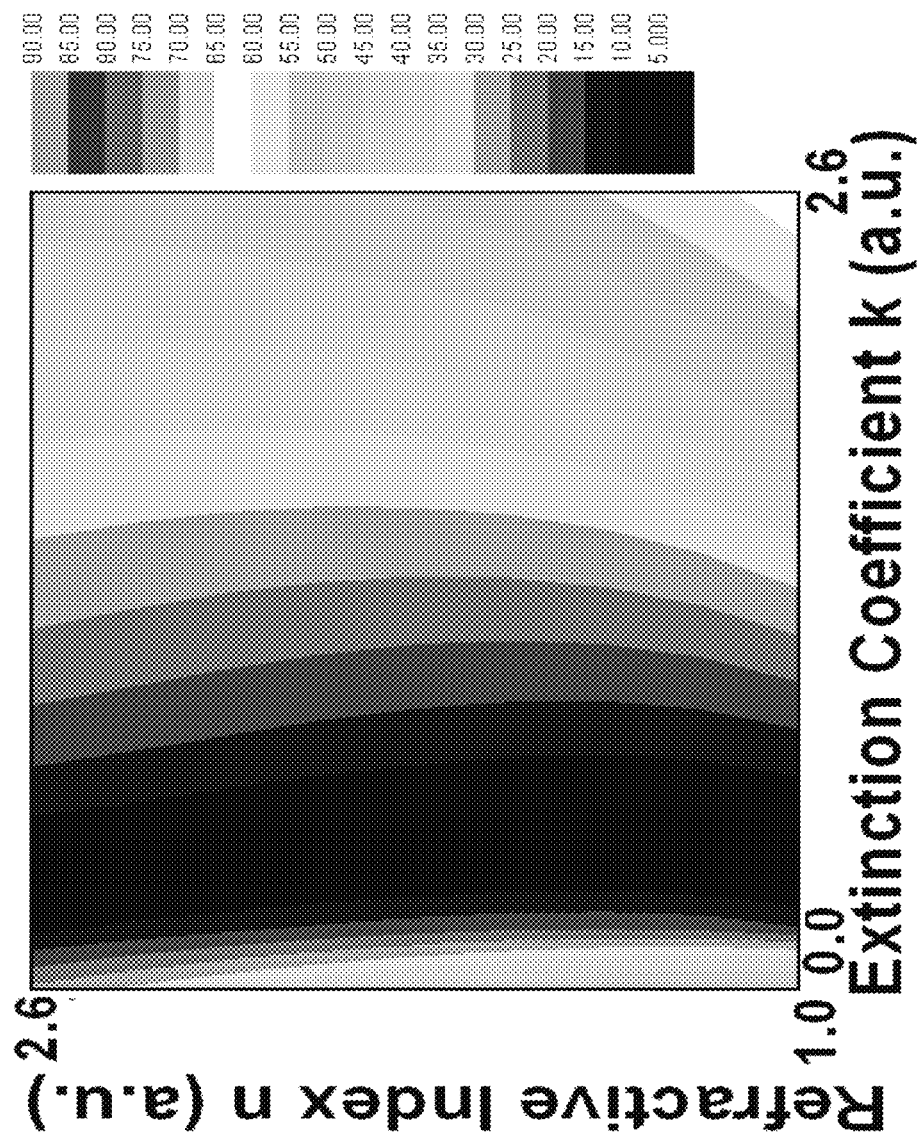
FIG. 19 illustrates the darkenable region when a Mo lower electrode is used and the parameter value of Equation 1 according to n and k values is calculated under the extinction interference condition at the wavelength of 600 nm as the exemplary embodiment of the present application.

FIG. 19 illustrated the blackening (darkenable) region when the Mo lower electrode having reflectance of 57.5% was used as the lower electrode and the parameter value of Equation 1 according to n and k values was calculated under the extinction interference condition at the wavelength of 600 nm.

It will be apparent to those skilled in the art that various modifications and changes may be made without departing from the range and spirit of the invention.

Therefore, it should be understood that the above embodiments are not limitative, but illustrative in all aspects. The range of the invention is defined by the appended claims rather than by the description preceding them, and therefore all changes and modifications that fall within metes and bounds of the claims, or equivalents of such metes and bounds are therefore intended to be embraced by the claims.

DESCRIPTION OF REFERENCE NUMERALS

100: Substrate
200: Darkening layer
220: Darkening layer
300: Conductive layer 201: Darkening pattern layer
221: Darkening pattern layer
301: Conductive pattern layer

The invention claimed is:
1. A conductive structure body comprising:
   a substrate;
   a conductive layer; and
   a darkening layer satisfying the following Equations 1 and 2 to light having at least one wavelength of light having the wavelength of 550 to 650 nm:

$$|R| = \left|\frac{1}{(n+1)^2 + k^2}\left[\{(n-1)^2 + k^2\} - 4nR_{Metal}\exp\left(-\frac{2\pi}{n} \cdot k\right)\right]\right| \leq 0.2 \quad \text{[Equation 1]}$$

$$d = \frac{\lambda}{4n}N(N = 1, 3, 5, \ldots) \quad \text{[Equation 2]}$$

wherein,
|R| is a parameter for reducing visuality of the conductive structure body,
n is a refractive index, k is an extinction coefficient, $R_{Metal}$ is a reflectance of the conductive layer,
d is a thickness of the darkening layer, and $\lambda$ is the wavelength of light.

2. The conductive structure body of claim 1, further comprising:
   a darkening layer satisfying Equations 1 and 2 to light having the wavelength of 600 nm.

3. The conductive structure body of claim 1, wherein a value of the following Equation 3 of the darkening layer is 51.8 or less:

$$A^* = 116 \times \left\{\left|\frac{1}{(n+1)^2 + k^2}\left[\{(n-1)^2 + k^2\} - 4n \cdot R_{Metal}\exp\left(-\frac{2\pi}{n} \cdot k\right)\right]\right|\right\}^{\frac{1}{3}} - 16 \quad \text{[Equation 3]}$$

wherein,
A* is a parameter showing brightness to a predetermined wavelength, and n, k, and $R_{Metal}$ are the same as definitions of Equation 1.

4. The conductive structure body of claim 3, wherein a value of Equation 3 of the darkening layer is 40 or less.

5. The conductive structure body of claim 1, wherein a value of the following Equation 15 of the darkening layer is 40 or less:

$$L^* = 116 \times \left(\frac{Y}{Y_n}\right)^{\frac{1}{3}} - 16 \quad \text{[Equation 15]}$$

wherein,
L* is a parameter showing brightness to an entire wavelength region of visible rays,
Y is a stimulus value corresponding to a green color of tri stimulus values of a CIE XYZ coordinate system, and
$Y_n$ is a normalized value of the stimulus value corresponding to a white color of the tri stimulus values of the CIE XYZ coordinate system.

6. The conductive structure body of claim 1, wherein the extinction coefficient k of the darkening layer is 0.2 or more and 2.5 or less.

7. The conductive structure body of claim 1, wherein the conductive layer is provided between the substrate and the darkening layer, and the parameter for reducing the visuality of the conductive structure body is measured in a direction of an opposite surface of a surface of the darkening layer in contact with the conductive layer.

8. The conductive structure body of claim 1, wherein the darkening layer is provided between the conductive layer and the substrate, and the parameter for reducing the visuality of the conductive structure body is measured in the substrate side.

9. The conductive structure body of claim 1, wherein the refractive index n of the darkening layer is more than 0 and 3 or less.

10. The conductive structure body of claim 1, wherein the parameter |R| for reducing the visuality of the conductive structure body is 0.15 or less.

11. The conductive structure body of claim 1, wherein a thickness d of the darkening layer is 20 nm to 150 nm.

12. The conductive structure body of claim 1, wherein a surface resistance of the darkening layer or the conductive layer is more than 0 Ω/square and 2 Ω/square or less.

13. The conductive structure body of claim 1, wherein the darkening layer includes one or two or more selected from the group consisting of metal, oxides thereof, nitrides thereof, oxynitrides thereof, and carbides thereof.

14. The conductive structure body of claim 1, wherein the darkening layer includes at least one of a dielectric material and a metal.

15. The conductive structure body of claim 1, wherein a thickness of the conductive layer is 0.01 μm to 10 μm.

16. The conductive structure body of claim 1, wherein the conductive layer includes one or more materials selected from the group consisting of a metal, a metal alloy, a metal oxide, and a metal nitride, and the materials have a specific resistance of $1 \times 10^{-6}$ Ω·cm to $30 \times 10^{-6}$ Ω·cm.

17. The conductive structure body of claim 1, wherein the conductive layer includes one or two or more selected from the group consisting of Cu, Al, Ag, Nd, Mo, Ni, oxides thereof, and nitrides thereof.

18. The conductive structure body of claim 1, wherein the darkening layer is provided on at least one surface of the conductive layer.

19. The conductive structure body of claim 1, wherein the conductive layer or the darkening layer is patterned.

20. The conductive structure body of claim 19, wherein a surface resistance of the conductive structure body is 1 Ω/square to 300 Ω/square.

21. The conductive structure body of claim 19, wherein the conductive layer and the darkening layer are patterned, and a line width of the patterned conductive layer is 10 μm or less.

22. The conductive structure body of claim 19, wherein the conductive layer and the darkening layer are patterned, and a line width of the patterned darkening layer is the same as or larger than a line width of the patterned conductive layer.

23. The conductive structure body of claim 19, wherein the conductive layer and the darkening layer are patterned, and the patterned darkening layer has an area of 80% to 120% of the area of the patterned conductive layer.

24. A touch screen panel comprising:
   the conductive structure body according to claim 1.

25. A display device comprising:
the conductive structure body according to claim 1.

26. A solar battery comprising:
the conductive structure body according to claim 1.

27. A method for manufacturing a conductive structure body, comprising:
forming a conductive layer on a substrate; and
forming a darkening layer satisfying the following Equations 1 and 2 to light having at least one wavelength of light having the wavelength of 550 nm to 650 nm before, after, or both before and after the conductive layer is formed:

$$|R| = \left| \frac{1}{(n+1)^2 + k^2} \left[ \{(n-1)^2 + k^2\} - 4nR_{Metal} \exp\left(-\frac{2\pi}{n} \cdot k\right) \right] \right| \leq 0.2 \quad \text{[Equation 1]}$$

$$d = \frac{\lambda}{4n} N (N = 1, 3, 5, \ldots) \quad \text{[Equation 2]}$$

wherein,

|R| is a parameter for reducing visuality of the conductive structure body, n is a refractive index, k is an extinction coefficient, $R_{Metal}$ is a reflectance of the conductive layer, d is a thickness of the darkening layer, and λ is the wavelength of light.

28. The method for manufacturing a conductive structure body of claim 27, wherein a surface resistance of the conductive layer or the darkening layer is more than 0 Ω/square and 2 Ω/square or less.

29. The method for manufacturing a conductive structure body of claim 27, further comprising:
separately or simultaneously patterning the conductive layer and the darkening layer.

30. The method for manufacturing a conductive structure body of claim 27, wherein the patterned darkening layer or the darkening layer satisfies Equations 1 and 2 to light having the wavelength of 600 nm.

31. The method for manufacturing a conductive structure body of claim 27, wherein a value of the following Equation 3 of the patterned darkening layer or the darkening layer is 51.8 or less:

$$A^* = 116 \times \left\{ \left| \frac{1}{(n+1)^2 + k^2} \left[ \{(n-1)^2 + k^2\} - 4n \cdot R_{Metal} \exp\left(-\frac{2\pi}{n} \cdot k\right) \right] \right| \right\}^{\frac{1}{3}} - 16 \quad \text{[Equation 3]}$$

wherein,

A* is a parameter showing brightness to a predetermined wavelength, and n, k, and $R_{Metal}$ are the same as definitions of Equation 1.

32. The method for manufacturing a conductive structure body of claim 27, wherein the patterned darkening layer or the darkening layer is formed by using a sputtering method.

33. A method for manufacturing a conductive structure body, comprising:
forming a patterned conductive layer on a substrate; and
forming a patterned darkening layer satisfying the following Equations 1 and 2 to light having at least one wavelength of light having the wavelength of 550 nm to 650 nm before, after, or both before and after the patterned conductive layer is formed:

$$|R| = \left| \frac{1}{(n+1)^2 + k^2} \left[ \{(n-1)^2 + k^2\} - 4nR_{Metal} \exp\left(-\frac{2\pi}{n} \cdot k\right) \right] \right| \leq 0.2 \quad \text{[Equation 1]}$$

$$d = \frac{\lambda}{4n} N (N = 1, 3, 5, \ldots) \quad \text{[Equation 2]}$$

wherein,

|R| is a parameter for reducing visuality of the conductive structure body, n is a refractive index, k is an extinction coefficient, RMetal is a reflectance of the conductive layer, d is a thickness of the darkening layer, and λ is the wavelength of light.

* * * * *